United States Patent
Lin et al.

(10) Patent No.: US 10,313,057 B2
(45) Date of Patent: Jun. 4, 2019

(54) ERROR DETECTION IN WIRELESS COMMUNICATIONS USING SECTIONAL REDUNDANCY CHECK INFORMATION

(71) Applicant: QUALCOMM Incorporated, San Diego, CA (US)

(72) Inventors: Jamie Menjay Lin, San Diego, CA (US); Yang Yang, San Diego, CA (US); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/607,161

(22) Filed: May 26, 2017

(65) Prior Publication Data
US 2017/0353269 A1    Dec. 7, 2017

Related U.S. Application Data

(60) Provisional application No. 62/346,291, filed on Jun. 6, 2016, provisional application No. 62/344,031, filed on Jun. 1, 2016.

(51) Int. Cl.
*H03M 13/00* (2006.01)
*H04L 1/00* (2006.01)
(Continued)

(52) U.S. Cl.
CPC ...... *H04L 1/0041* (2013.01); *H03M 13/2906* (2013.01); *H03M 13/2933* (2013.01);
(Continued)

(58) Field of Classification Search
None
See application file for complete search history.

(56) References Cited

U.S. PATENT DOCUMENTS 5,583,500 A    12/1996  Allen et al.
5,844,918 A *  12/1998  Kato ............... H03M 13/03
                                                714/751

(Continued)

FOREIGN PATENT DOCUMENTS

CN    101682381 A    3/2010
CN    102783206 A    11/2012
(Continued)

OTHER PUBLICATIONS

Trifonov P., et al., "Fast Encoding of Polar Codes with Reed-Solomon Kernel," IEEE Transactions on Communications, May 2016, pp. 1-8.

(Continued)

*Primary Examiner* — Mujtaba M Chaudry
(74) *Attorney, Agent, or Firm* — Qualcomm IP Dept.; James Hunt Yancey, Jr.

(57) ABSTRACT

Certain aspects of the present disclosure relate to techniques and apparatus for increasing decoding performance and/or reducing decoding complexity. An exemplary method generally includes obtaining a payload to be transmitted, partitioning the payload into a plurality of payload sections, deriving redundancy check information for each respective payload section of the plurality of payload sections, merging the redundancy check information for each payload section with the plurality of payload sections to form a sequence of bits, and generating a codeword by encoding the sequence of bits using an encoder. Other aspects, embodiments, and features are also claimed and described.

29 Claims, 14 Drawing Sheets

(51) Int. Cl.
*H03M 13/29* (2006.01)
*H03M 13/39* (2006.01)
*H03M 13/09* (2006.01)

(52) U.S. Cl.
CPC ... *H03M 13/3938* (2013.01); *H03M 13/6522* (2013.01); *H04L 1/0045* (2013.01); *H04L 1/0054* (2013.01); *H04L 1/0061* (2013.01); *H04L 1/0064* (2013.01); *H03M 13/09* (2013.01)

(56) References Cited

U.S. PATENT DOCUMENTS

| | | | |
|---|---|---|---|
| 6,633,865 | B1 | 10/2003 | Liao |
| 6,854,082 | B1 | 2/2005 | Rhee |
| 6,931,581 | B1 * | 8/2005 | Cassiday ............... H03M 13/09 714/758 |
| 6,961,888 | B2 | 11/2005 | Jin et al. |
| 7,133,853 | B2 | 11/2006 | Richardson et al. |
| 7,526,717 | B2 | 4/2009 | Kyung et al. |
| 7,552,097 | B2 | 6/2009 | Richardson et al. |
| 7,571,372 | B1 | 8/2009 | Burd et al. |
| 7,627,801 | B2 | 12/2009 | Jin et al. |
| 7,793,194 | B2 | 9/2010 | Seo et al. |
| 7,840,880 | B1 | 11/2010 | Bain |
| 7,979,784 | B2 | 7/2011 | Shao et al. |
| 7,986,622 | B2 | 7/2011 | Frazier et al. |
| 8,006,162 | B2 | 8/2011 | Choi et al. |
| 8,132,072 | B2 | 3/2012 | El-Khamy et al. |
| 8,687,751 | B1 | 4/2014 | Lee et al. |
| 8,751,902 | B2 | 6/2014 | Jin et al. |
| 9,362,956 | B2 | 6/2016 | Mahdavifar et al. |
| 9,479,375 | B1 | 10/2016 | Ankarali et al. |
| 9,667,381 | B2 | 5/2017 | Jeong et al. |
| 9,692,451 | B2 | 6/2017 | Vasista et al. |
| 9,917,675 | B2 | 3/2018 | Kudekar et al. |
| 2002/0147954 | A1 | 10/2002 | Shea |
| 2003/0033575 | A1 | 2/2003 | Richardson et al. |
| 2003/0123409 | A1 * | 7/2003 | Kwak ............... H04L 1/0061 370/335 |
| 2004/0187129 | A1 | 9/2004 | Richardson |
| 2005/0078765 | A1 | 4/2005 | Jeong et al. |
| 2005/0149842 | A1 | 7/2005 | Kyung et al. |
| 2005/0283707 | A1 | 12/2005 | Sharon et al. |
| 2006/0020868 | A1 | 1/2006 | Richardson et al. |
| 2006/0020872 | A1 | 1/2006 | Richardson et al. |
| 2006/0184855 | A1 | 8/2006 | Wang et al. |
| 2007/0113148 | A1 | 5/2007 | Hong et al. |
| 2008/0178065 | A1 | 7/2008 | Khandekar et al. |
| 2008/0207120 | A1 | 8/2008 | Kurina et al. |
| 2009/0158129 | A1 | 6/2009 | Myung et al. |
| 2009/0204868 | A1 | 8/2009 | Park et al. |
| 2009/0217129 | A1 | 8/2009 | Myung et al. |
| 2009/0300461 | A1 | 12/2009 | Shor et al. |
| 2010/0023834 | A1 | 1/2010 | Richardson et al. |
| 2010/0077275 | A1 | 3/2010 | Yu et al. |
| 2010/0107033 | A1 | 4/2010 | Kuri et al. |
| 2010/0185926 | A1 * | 7/2010 | Lawson ............... H04L 1/0061 714/807 |
| 2010/0211844 | A1 | 8/2010 | Yuda et al. |
| 2010/0257425 | A1 | 10/2010 | Yue et al. |
| 2011/0047433 | A1 | 2/2011 | Abu-Surra et al. |
| 2011/0066916 | A1 | 3/2011 | Abu-Surra et al. |
| 2012/0084625 | A1 | 4/2012 | Pisek et al. |
| 2012/0166917 | A1 | 6/2012 | El-Khamy et al. |
| 2012/0240001 | A1 | 9/2012 | Abu-Surra et al. |
| 2012/0317461 | A1 | 12/2012 | Hwang et al. |
| 2013/0117344 | A1 | 5/2013 | Gross et al. |
| 2014/0019820 | A1 | 1/2014 | Vardy et al. |
| 2014/0040214 | A1 | 2/2014 | Ma et al. |
| 2014/0201592 | A1 | 7/2014 | Shen et al. |
| 2014/0229788 | A1 | 8/2014 | Richardson |
| 2014/0229789 | A1 | 8/2014 | Richardson |
| 2014/0304574 | A1 | 10/2014 | Seo et al. |
| 2014/0365842 | A1 | 12/2014 | Li et al. |
| 2014/0365845 | A1 | 12/2014 | Pantelias et al. |
| 2015/0188666 | A1 | 7/2015 | Mahdavifar et al. |
| 2015/0229337 | A1 | 8/2015 | Alhussien et al. |
| 2015/0381208 | A1 * | 12/2015 | Li ............... H03M 13/13 714/755 |
| 2016/0013810 | A1 | 1/2016 | Gross et al. |
| 2016/0013931 | A1 | 1/2016 | Pisek et al. |
| 2016/0087648 | A1 | 3/2016 | Korb et al. |
| 2016/0164537 | A1 | 6/2016 | Pisek et al. |
| 2016/0164629 | A1 | 6/2016 | Ahn et al. |
| 2016/0173132 | A1 | 6/2016 | Cho |
| 2016/0380763 | A1 | 12/2016 | Ahn et al. |
| 2017/0047947 | A1 * | 2/2017 | Hong ............... H03M 13/2906 |
| 2017/0141798 | A1 | 5/2017 | Kudekar et al. |
| 2017/0222663 | A1 | 8/2017 | Parthasarathy et al. |
| 2017/0331494 | A1 | 11/2017 | Richardson et al. |
| 2017/0331497 | A1 | 11/2017 | Richardson et al. |
| 2017/0353267 | A1 | 12/2017 | Kudekar et al. |
| 2017/0359086 | A1 | 12/2017 | Kudekar et al. |
| 2017/0359148 | A1 | 12/2017 | Richardson et al. |
| 2018/0034593 | A1 | 2/2018 | Xu et al. |
| 2018/0205498 | A1 | 7/2018 | Kudekar et al. |
| 2018/0226992 | A1 | 8/2018 | Panteleev et al. |
| 2018/0358984 | A1 | 12/2018 | Richardson et al. |
| 2018/0367245 | A1 | 12/2018 | Soriaga et al. |

FOREIGN PATENT DOCUMENTS

| | | |
|---|---|---|
| CN | 103746708 A | 4/2014 |
| CN | 105227189 A | 1/2016 |
| EP | 1601109 A2 | 11/2005 |
| EP | 2091171 A2 | 8/2009 |
| EP | 2096760 A1 | 9/2009 |
| EP | 2899912 A1 | 7/2015 |
| EP | 3264611 A1 | 1/2018 |
| WO | WO-2017209837 A1 | 12/2017 |
| WO | WO-2018128560 A1 | 7/2018 |

OTHER PUBLICATIONS

Deng X., et al., "Segmented Cyclic Redundancy Check: A Data Protection Scheme for Fast Reading RFID Tag's Memory," IEEE Wireless Communications and Networking Conference, 2008, pp. 1576-1581.

Chen B., et al., "List Viterbi Algorithms for Continuous Transmission", IEEE Transactions on Communications, vol. 49 No. 5, pp. 784-792, May 2001.

Ericsson: "Performance and Complexity of Per-Segment CRC Attachment Methods" 3GPP DRAFT; R1-073741, 3rd Generation Partnership Project (3GPP), Mobile Competence Centre, 650, Route Des Lucioles, F-06921, Sophia-Antipolis Cedex, France, vol. RAN WG1, No. Athens, Greece; Aug. 15, 2007, XP050107330, 3 pages.

International Search Report and Written Opinion, PCT/US2017/025421, Mar. 31, 2017, International Search Authority—European Patent Office, Nov. 7, 2017, pp. 1-33.

International Search Report and Written Opinion—PCT/US2017/035026—ISA/EPO—Nov. 6, 2017.

Jun Lin et al., "A reduced latency list decoding algorithm for polar codes", 2014 IEEE Workshop on Signal Processing Systems (SIPS), Oct. 1, 2014, p. 1-6.

Lucas R et al., "Improved Soft-Decision Decoding of Reed-Muller Codes Generalized Multiple Concatenated Codes", ITG-FACHBERI, vol. 183, VDE-Verlag, DE, No. 146, Mar. 5, 1998, pp. 137-142.

Arikan E., "A Survey of Reed-Muller Codes From Polar Coding Perspective", Information Theory Workshop (ITW), Piscataway, NJ, USA, Jan. 6, 2010, pp. 1-5, XP031703947, ISBN: 978-1-4244-6372-5.

El-Khamy M., et al., "Binary Polar Codes are Optimized Codes for Bitwise Multistage Decoding", Arxiv.org, Cornell University Library, 201 Olin Library Cornell University Ithaca, NY 14853, Apr. 13, 2016, XP080695103, DOI: 10.1049/EL.2016.0837, 2 pages.

Mahdavifar H., et al., "On the Construction and Decoding of Concatenated Polar Codes", IEEE International Symposium on

(56) References Cited

OTHER PUBLICATIONS

Information Theory, Jul. 7, 2013, pp. 952-956, XP032497043, ISSN: 2157-8095, DOI: 10.1109/ISIT.2013.6620367 [retrieved on Oct. 3, 2013].
Stolte N., Rekursive Codes mit der Plotkin-Konstruktion and ihre Decodierung, D17 Darmstadter Dissertation, Jan. 1, 2002, 151 pages, (in particular, pp. 13-30), XP055241445A, URL:http:l/tuprints.ulb.tu-darmstadt.de/epda/000183/stolte.pdf, Techn. Universitat, Diss., 2002 (Nicht f. d. Austausch)_Darmstadt [retrieved on Jan. 14, 2016].
Wang T., et al., "Parity-Check-Concatenated Polar Codes", IEEE Communications Letters, IEEE Service Center, Piscataway, NJ, US, vol. 20, No. 12, Dec. 1, 2016, pp. 2342-2345, XP011636292, ISSN: 1089-7798, DOI: 10.1109/LCOMM.2016.2607169 [retrieved on Dec. 8, 2016].
Wang Y., et al., "Concatenations of Polar Codes With Outer BCH Codes and Convolutional Codes", 2014 52nd Annual Allerton Conference on Communication, Control, and Computing (ALLERTON), Sep. 30, 2014, pp. 813-819, XP032731136, DOI: 10.1109/ALLERTON2014.7028538 [retrieved on Jan. 30, 2015].
Chiu M.C., et al., "Reduced-Complexity SCL Decoding of Multi-CRC-Aided Polar Codes", Sep. 28, 2016, XP055384603, pp. 1-9, Retrieved from the Internet: URL:https://arxiv.org/pdf/1609.08813.pdf [retrieved on Jun. 23, 2017].
Guo J., et al., "Multi-CRC Polar Codes and Their Applications", IEEE Communications Letters; Feb. 2016, vol. 20, No. 2, pp. 212-215.
Trifonov P., "Efficient Design and Decoding of Polar Codes", IEEE Transactions on Communications, vol. 60, No. 11, Nov. 1, 2012, XP011473857, ISSN: 0090-6778, DOI: 10.1109/TCOMM.2012.081512.110872, pp. 3221-3227.
Trifonov P., et al., "Generalized Concatenated Codes based on Polar Codes", 8th International Symposium on Wireless Communication Systems, Nov. 6, 2011, XP032090122, pp. 442-446, DOI: 10.11 09/ISWCS.2011.6125399, ISBN: 978-1-61284-403-9.
Zhou H., et al., "Segmented CRC-Aided SC List Polar Decoding", 2016 IEEE 83rd Vehicular Technology Conference, May 15, 2016, XP032918751, pp. 1-5, DOI: 10.1109/VTCSPRING.2016.7504469, [retrieved on Jul. 5, 2016].
Hashemi S.A., et al., "Partitioned Successive-Cancellation List Decoding of Polar Codes", 2016 IEEE International Conference on Acoustics. Speech and Signal Processing (ICASSP), Mar. 20, 2016, pp. 957-960, XP032900743, DOI: 10.1109/ICASSP.2016.7471817, [retrieved on May 18, 2016].
Mackay D.J.C., "Good Error-Correcting Codes Based on Very Sparse Matrices," IEEE Transactions on Information Theory, Mar. 1999, vol. 45 (2), pp. 399-431.
Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.
Shea J.M., et al., "Multidimensional Codes" In: "Wiley Encyclopedia of Telecommunications," Jan. 1, 2003, vol. 3, pp. 1538-1551, XP055402230.
Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.
International Preliminary Report on Patentability; PCT/US2017/035026; Aug. 14, 2018.
Chapter II Demand and Amendment under PCT Article 34 dated Jan. 18, 2018; PCT/US2017/035026.
Written Opinion of the International Preliminary Examining Authority dated May 14, 2018—PCT/US2017/035026.
Abbasfar A., et al., "Accumulate Repeat Accumulate Codes", Dec. 2, 2003, XP002585965, Retrieved from the Internet: URL: http://trs-new.jpl.nasa.gov/dspace/bitstream/2014/8047/1/03-3469.pdf [retrieved on Jun. 4, 2010], 6 pages.
Alcatel-Lucent et al., "LDPC Coding Proposal for LBC", 3GPP2 Draft; C30-20070226-002_C30-20070212-034R1_AHLQRZ_LDPC_Proposal_For_LBC, Mar. 27, 2007, XP062206073, Retrieved from the Internet: URL:http://ftp.3gpp2.org/TSGC/Working/2007/2007-03-Atlanta/TSG-C-2007-03-Atlanta/WG3/LDPC Ad Hoc Call,2007.02.26/ pp. 1-27.
Alcatel-Lucent et al., "LDPC Coding Proposal for LBC", 3GPP2-Drafts, 2500 Wilson Boulevard, Suite 300, Arlington, Virginia 22201, USA, Mar. 15, 2007, XP040477608, 32 pages.
Arikan E., "Channel Polarization: a Method for Constructing Capacity-Achieving Codes for Symmetric Binary-Input Memoryless Channels," IEEE Transactions on Information Theory, vol. 55 (7), 2009, pp. 3051-3073, XP080428257.
Chen T.Y., et al., "Protograph-based Raptor-Like LDPC Codes with Low Thresholds", IEEE International Conference on Communications, Jun. 10, 2012, DOI: 10.1109/ICC.2012.6363996, ISBN: 978-1-4577-2052-9, pp. 2161-2165.
El-Khamy M., et al., "Design of Rate Compatible Structured LDPC Codes for Hybrid ARQ Applications", IEEE, Aug. 1, 2009, vol. 27(6), pp. 965-973.
Ericsson: "Design Parameters and Implementation Aspects of LPDC Codes," 3GPP Draft; R1-1703537 Design Parameters and Implementation Aspects of LDPC Codes, 3rd Generation Partnership Project (3GPP), Mobile Competence Centre; 650, Route Des Lucioles; F-06921 Sophia-Antipolis, vol. RAN WG1, No. Athens, Greece; 20170213-20170217, Feb. 15, 2017, XP051222070, 10 pages, Retrieved from the Internet: URL: http://www.3gpp.org/ftp/tsg_ran/WG1_RL1/TSGR1_88/Docs/ [retrieved on Feb. 15, 2017].
IEEE: "IEEEStd 802.16e-2005, Air Interface for Fixed and Mobile Broadband Wireless Access Systems," Amendment 2 and Corrigendum 1 to IEEE Std 802.16-2004, IEEE STD 802.16E-2005, Feb. 28, 2006 (Feb. 28, 2016), pp. 626-630, XP002515198.
"IEEE Standard for Local and Metropolitan Area Networks Part 16: Air Interface for Broadband Wireless Access Systems; IEEE Std 802.16-2009 (Revision of IEEE Std 802.16-2004)", May 29, 2009, XP068045637, ISBN: 978-0-7381-5919-5, pp. 1-2080.
Jiang M., et al., "An Improved Variable Length Coding Scheme Using Structured LDPC Codes", IEEE, Oct. 1, 2010, 5 pages.
Liu J., et al., "Rate-Compatible LDPC Codes with Short Block Lengths Based on Puncturing and Extension Techniques," 2014, pp. 1-20.
Mediatek Inc: "Multi-Codebook Embedded Compact QC-LDPC Designs", 3GPP TSG-RAN WG1 NR, R1-1706175, Apr. 4, 2017, XP051252463, Retrieved from the Internet: URL:http://www.3gpp.org/ftp/tsg_ran/WG1_RL1/TSGR1_88b/Docs/, 14 pages.
Myung S., et al., "Extension of Quasi-cyclic LDPC Codes by Lifting," PROC., IEEE International Symposium on Information Theory, ISIT 2005, Adelaide, Australia, Sep. 4, 2005 (Sep. 4, 2005), Sep. 9, 2005 (Sep. 9, 2005), pp. 2305-2309, XP010845965, ISBN: 978-0-7803-9151-2.
Myung S., et al., "Lifting Methods for Quasi-Cyclic LDPC Codes", IEEE Communications Letters, Jun. 2006, vol. 10, No. 6, pp. 489-491.
Nguyen T.V., et al., "The Design of Rate-Compatible Protograph LDPC Codes", IEEE Transactions on Communications, Oct. 1, 2012, vol. 60, No. 10, XP011469171, ISSN: 0090-6778, DOI: 10.1109/TCOMM.2012.081012.110010, pp. 2841-2850.
Niu K., et al., "CRC-Aided Decoding of Polar Codes," IEEE Communications Letters, Oct. 2012, vol. 16, No. 10, pp. 1668-1671.
Qualcomm Incorporated: "LDPC Codes-HARQ, Rate", 3GPP Draft; R1-162209, LDPC_Ratecompatibilty_Highleveldesign, 3rd Generation Partnership Project (3GPP), Mobile Competence Centre, 650, Route Des Lucioles; F-06921 Sophia-Antipolis Cedex; France, vol. RAN WG1, No. Busan, Korea; Apr. 2, 2016, XP051080037, Retrieved from the Internet: URL:http://www.3gpp.org/ftp/tsg_ran/WG1_RL1/TSGR1_84b/Docs/, 4 pages.
Qualcomm Incorporated: "LDPC Rate Compatible Design Overview", 3GPP Draft; R1-1610137, 3rd Generation Partnership Project (3GPP), Mobile Competence Centre, 650, Route Des Lucioles; F-06921; Sophia-Anti Polis Cedex, vol. RAN WG1. No. Lisbon, Portugal, Oct. 9, 2016, 27 pages, XP051150160, Retrieved from the Internet: URL: http://www.3gpp.org/ftp/Meetings_3GPP_SYNC/RAN1/Docs/ [retrieved on Oct. 9, 2016].
Richardson T., et al., "Design of Low-Density Parity Check Codes for 5G New Radio," IEEE Communications Magazine, vol. 56 (3), Mar. 1, 2018, pp. 28-34, XP055480192.

(56) References Cited

OTHER PUBLICATIONS

Tal I., et al., "List Decoding of Polar Codes", IEEE Transactions on Information Theory, Institute of Electrical and Electronics Engineers, May 2015, vol. 61, No. 5, pp. 2213-2226.

Arikan E., "Challenges and some new directions in channel coding," Computer Science, Information Theory, arXiv:1504.03916, Apr. 15, 2015, 11 pages.

Leroux C., et al., "A Semi-Parallel Successive-Cancellation Decoder for Polar Codes," IEEE Transactions on Signal Processing, Jan. 2013, vol. 61, No. 2, pp. 1-11.

Mahdavifar H., et al., "Fast Multi-dimensional Polar Encoding and Decoding," Information Theory and Applications Workshop (ITA), IEEE, 2014, 5 pages.

Ericsson: "System Information for Low Complexity and Extended Coverage", 3GPP Draft; R1-1708730—Sysinfo for Low Complexity and Ext Coverage, 3rd Generation Partnership Project (3GPP), Mobile Competence Centre; 650, Route Des Lucioles; F-06921 Sophia-Antipolis Cedex; France, vol. RAN WG1, No. Hangzhou, China; 20170515-20170519 May 7, 2017, XP051263297, Retrieved from the Internet: URL:http://www.3gpp.org/ftp/tsg_ran/WG1_RL1/TSGR1_89/Docs/ [retrieved on May 7, 2017], 3 pages.

Nokia et al., "LDPC Design for eMBB", 3GPP Draft; R1-1705857_LDPC Design for EMBB, 3rd Generation Partnership Project (3GPP), Mobile Competence Centre; 650, Route Des Lucioles; F-06921 Sophia-Antipolis Cedex; France, vol. RAN WG1, No. Spokane, WA, USA; 20170403-20170407 Mar. 24, 2017, XP051250965, Retrieved from the Internet: URL:http://www.3gpp.org/ftp/tsg_ran/WG1_RL1/TSGR1_88b/Docs/ [retrieved on Mar. 24, 2017], 8 pages.

Qualcomm Incorporated: "LDPC Rate Matching", 3GPP Draft; R1-1708640_LDPC Rate_Matching, 3rd Generation Partnership Project (3GPP), Mobile Competence Centre; 650, Route Des Lucioles; F-06921 Sophia-Antipolis Cedex; France, vol. RAN WG1, No. Hangzhou, China; 20170515-20170519 May 14, 2017, XP051273827, Retrieved from the Internet: URL:http://www.3gpp.org/ftp/Meetings_3GPP_SYNC/RAN1/Docs/ [retrieved on May 14, 2017], 3 pages.

Surra S.A., et al., "Gigabit Rate Achieving Low-Power LDPC Codes: Design And Architecture", IEEE, Mar. 1, 2011, pp. 1994-1999.

Tal I., et al., "List Decoding of Polar Codes", IEEE Transactions on Information Theory, May 31, 2012, pp. 1-11.

Xie Y., et al., "Design of Rate Compatible Protograph-based LDPC Codes with Mixed Circulants", IEEE, 6th International Symposium on Turbo Codes & Iterative Information Processing, Sep. 2010, pp. 434-438.

ZTE: "Structured LDPC Coding with Rate Matching", 3GPP Draft; R1-060115, Mobile Competence Centre; 650, Route Des Lucioles; F-06921 Sophia-Antipolis Cedex; France, vol. RAN WG1, No. Helsinki, Finland; Jan. 19, 2006, XP050950962, Retrieved from the Internet: URL:http://www.3gpp.org/ftp/tsg_ran/WG1_RL1/TSGR1_AH/LTE_AH_0601/Docs/, 13 pages.

International Search Report and Written Opinion—PCT/US2018/038229—ISA/EPO—Nov. 29, 2018.

* cited by examiner

Convolutional Code (CC)

Information bit stream:   1 1 0 0 1 0 1 0
Encoding process:  [0 0 0 1] 1 0 0 1 0 1 0 0 0 0  → coded bit 1,2,3
　　　　　　　　  0 [0 0 1 1] 0 0 1 0 1 0 0 0 0  → coded bit 4,5,5
　　　　　　　　  0 0 [0 1 1 0] 0 1 0 1 0 0 0 0  → coded bit 7,8,9
　　　　　　　　  0 0 0 [1 1 0 0] 1 0 1 0 0 0 0  → coded bit 10,11,12

0 0 0 1 1 0 0 1 0 1 [0 0 0 0] → coded bit 31,32,33

Tail Biting Convolutional Code (TBCC)

Viterbi Algorithm For TBCC

Viterbi Algorithm For TBCC (cont')

1. Start with equal weight for each state in the first iteration
2. At the end of the trellis construction, identify a number of best states
3. Take the back trace output over a certain range of stages for the decoded bits

ERROR DETECTION IN WIRELESS COMMUNICATIONS USING SECTIONAL REDUNDANCY CHECK INFORMATION

CLAIM OF PRIORITY UNDER 35 U.S.C. § 119

This application claims benefit of U.S. Provisional Patent Application Ser. No. 62/346,291, filed Jun. 6, 2016, which is herein incorporated by reference in its entirety. Additionally, this application herein incorporates U.S. Provisinal Patent Application Ser. No. 62/344,031, filed Jun. 1, 2016 by reference in its entirety.

TECHNICAL FIELD

Certain aspects of the technology discussed below generally relate to wireless communications and, more particularly, to a method and apparatus for convolutional coding/tail biting convolutional coding with sectional redundancy check.

INTRODUCTION

In a transmitter of all modern wireless communication links, an output sequence of bits from an error correcting code can be mapped onto a sequence of complex modulation symbols. These symbols can be then used to create a waveform suitable for transmission across a wireless channel. Particularly as data rates increase, decoding performance on the receiver side can be a limiting factor to achievable data rates.

BRIEF SUMMARY OF SOME EMBODIMENTS

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Certain aspects of the present disclosure provide techniques and apparatus for convolutional coding/tail biting convolutional coding with sectional redundancy check. Embodiments can enable and provide fast, efficient coding techniques for error detection for overall payloads and additional error detection capability for sectional payloads with sectional redundancy check. Sectional redundancy checks aim to provide additional insight (into error symptoms) enabling encoding/decoding for improved performance. Sectional CRC also referred to as multiple CRC segments or multiple segments of CRC enable additional granularity for CRC information yielding improved code block error rate performance and/or decoding complexity reduction. Techniques provide new coding structure arrangements enabling using error symptom insights to gain in decoding performance and/or reduce in decoding complexity.

Certain aspects provide a method for wireless communications. The method generally includes obtaining a payload to be transmitted, partitioning the payload into a plurality of payload sections, deriving redundancy check information for each respective payload section of the plurality of payload sections, merging the redundancy check information for each payload section with the plurality of payload sections to form a sequence of bits, and generating a codeword by encoding the sequence of bits using an encoder.

Certain aspects provide an apparatus for wireless communications. The apparatus generally includes at least one processor configured to obtain a payload to be transmitted, partition the payload into a plurality of payload sections, derive redundancy check information for each respective payload section of the plurality of payload sections, merge the redundancy check information for each payload section with the plurality of payload sections to form a sequence of bits, and generate a codeword by encoding the sequence of bits using an encoder. The apparatus also generally includes a memory coupled with the at least one processor.

Certain aspects provide an apparatus for wireless communications. The apparatus generally includes means for obtaining a payload to be transmitted, means for partitioning the payload into a plurality of payload sections, means for deriving redundancy check information for each respective payload section of the plurality of payload sections, means for merging the redundancy check information for each payload section with the plurality of payload sections to form a sequence of bits, and means for generating a codeword by encoding the sequence of bits using an encoder.

Certain aspects provide a non-transitory computer-readable medium for wireless communications. The non-transitory computer-readable medium generally includes code for obtaining a payload to be transmitted, partitioning the payload into a plurality of payload sections, deriving redundancy check information for each respective payload section of the plurality of payload sections, merging the redundancy check information for each payload section with the plurality of payload sections to form a sequence of bits, and generating a codeword by encoding the sequence of bits using an encoder.

Certain aspects provide a method for wireless communications. The method generally includes receiving a codeword comprising a plurality of payload sections, decoding the plurality of payload sections of the code word, and verifying each decoded payload section of the plurality of payload sections based on redundancy check information corresponding to that decoded payload section.

Certain aspects provide an apparatus for wireless communications. The apparatus generally includes at least one processor configured to receive a codeword comprising a plurality of payload sections, decode the plurality of payload sections of the code word, and verify each decoded payload section of the plurality of payload sections based on redundancy check information corresponding to that decoded payload section.

Certain aspects provide an apparatus for wireless communications. The apparatus generally includes means for receiving a codeword comprising a plurality of payload sections, means for decoding the plurality of payload sections of the code word, and means for verifying each decoded payload section of the plurality of payload sections based on redundancy check information corresponding to that decoded payload section.

Certain aspects provide a non-transitory computer-readable medium for wireless communications. The non-transitory computer-readable medium generally includes code for receiving a codeword comprising a plurality of payload sections, decoding the plurality of payload sections of the code word, and verifying each decoded payload section of the plurality of payload sections based on redundancy check information corresponding to that decoded payload section.

The techniques may be embodied in methods, apparatuses, and computer program products. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
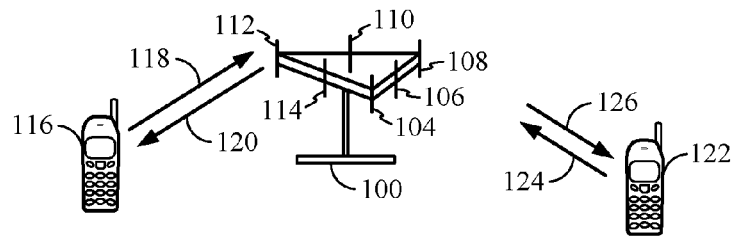
FIG. 1 illustrates an example wireless communication system in accordance with certain aspects of the present disclosure.

Aspects of the present disclosure provide a new code structure. The structure provides and enables using error symptom insights to increase decoding performance and/or reduce decoding complexity. This may occur, for example, by partitioning a payload into a plurality of sections and deriving redundancy check information for each of the sections. Without changing a total number of redundancy check bits and payload bits, aspects of the present disclosure present techniques for providing additional insights into decoding error symptoms. Doing so yields improved encoder/decoder designs and techniques by enabling certain sophisticated handling to achieve improved code block error rate performance and/or decoding complexity reduction while maintaining unaffected overall false detection rates.

An Example Wireless Communication System

The techniques described herein may be used for various wireless communication networks such as Orthogonal Frequency Division Multiplexing (OFDM) networks, Time Division Multiple Access (TDMA) networks, Frequency Division Multiple Access (FDMA) networks, Orthogonal FDMA (OFDMA) networks, Single-Carrier FDMA (SC-FDMA) networks, Code Division Multiple Access (CDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16 (e.g., WiMAX (Worldwide Interoperability for Microwave Access)), IEEE 802.20, Flash-OFDM®, etc. UTRA, E-UTRA, and GSM are part of Universal Mobile Telecommunication System (UMTS). Long Term Evolution (LTE) and Long Term Evolution Advanced (LTE-A) are upcoming releases of UMTS that use E-UTRA. UTRA, E-UTRA, GSM, UMTS and LTE are described in documents from an organization named "3rd Generation Partnership Project" (3GPP). CDMA2000 is described in documents from an organization named "3rd Generation Partnership Project 2" (3GPP2). CDMA2000 is described in documents from an organization named "3rd Generation Partnership Project 2" (3GPP2). These various radio technologies and standards are known in the art. For clarity, certain aspects of the techniques are described below for LTE and LTE-A.

The teachings herein may be incorporated into (e.g., implemented within or performed by) a variety of wired or wireless apparatuses (e.g., nodes). In some aspects a node comprises a wireless node. Such wireless node may provide, for example, connectivity for or to a network (e.g., a wide area network such as the Internet or a cellular network) via a wired or wireless communication link. In some aspects, a wireless node implemented in accordance with the teachings herein may comprise an access point or an access terminal.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology. In some implementations an access point may comprise a set top box kiosk, a media center, or any other suitable device that is configured to communicate via a wireless or wired medium.

An access terminal ("AT") may comprise, be implemented as, or known as an access terminal, a subscriber station, a subscriber unit, a mobile station, a remote station, a remote terminal, a user terminal, a user agent, a user device, user equipment, a user station, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), a tablet, an entertainment device (e.g., a music or video device, or a satellite radio), a television display, a flip-cam, a security video camera, a digital video recorder (DVR), a global positioning system device, sensor, industrial equipment, medical devices, implantable devices, wearables, mammal implant devices, vehicles or vehicular components, drones, internet of things devices, or any other suitable device that is configured to communicate via a wireless or wired medium.

Referring to FIG. 1, a multiple access wireless communication system according to one aspect is illustrated. In an aspect of the present disclosure, the wireless communication system from FIG. 1 may be a wireless mobile broadband system based on Orthogonal Frequency Division Multiplexing (OFDM). An access point 100 (AP) may include multiple antenna groups, one group including antennas 104 and 106, another group including antennas 108 and 110, and an additional group including antennas 112 and 114. In FIG. 1, only two antennas are shown for each antenna group, however, more or fewer antennas may be utilized for each antenna group. Access terminal 116 (AT) may be in communication with antennas 112 and 114, where antennas 112 and 114 transmit information to access terminal 116 over forward link 120 and receive information from access terminal 116 over reverse link 118. Access terminal 122 may be in communication with antennas 106 and 108, where antennas 106 and 108 transmit information to access terminal 122 over forward link 126 and receive information from access terminal 122 over reverse link 124. In a FDD system, communication links 118, 120, 124 and 126 may use different frequency for communication. For example, forward link 120 may use a different frequency then that used by reverse link 118.

Each group of antennas and/or the area in which they are designed to communicate is often referred to as a sector of the access point. In one aspect of the present disclosure each antenna group may be designed to communicate to access terminals in a sector of the areas covered by access point 100.

In communication over forward links 120 and 126, the transmitting antennas of access point 100 may utilize beamforming in order to improve the signal-to-noise ratio of forward links for the different access terminals 116 and 122. Also, an access point using beamforming to transmit to access terminals scattered randomly through its coverage causes less interference to access terminals in neighboring cells than an access point transmitting through a single antenna to all its access terminals.

Figure 2:
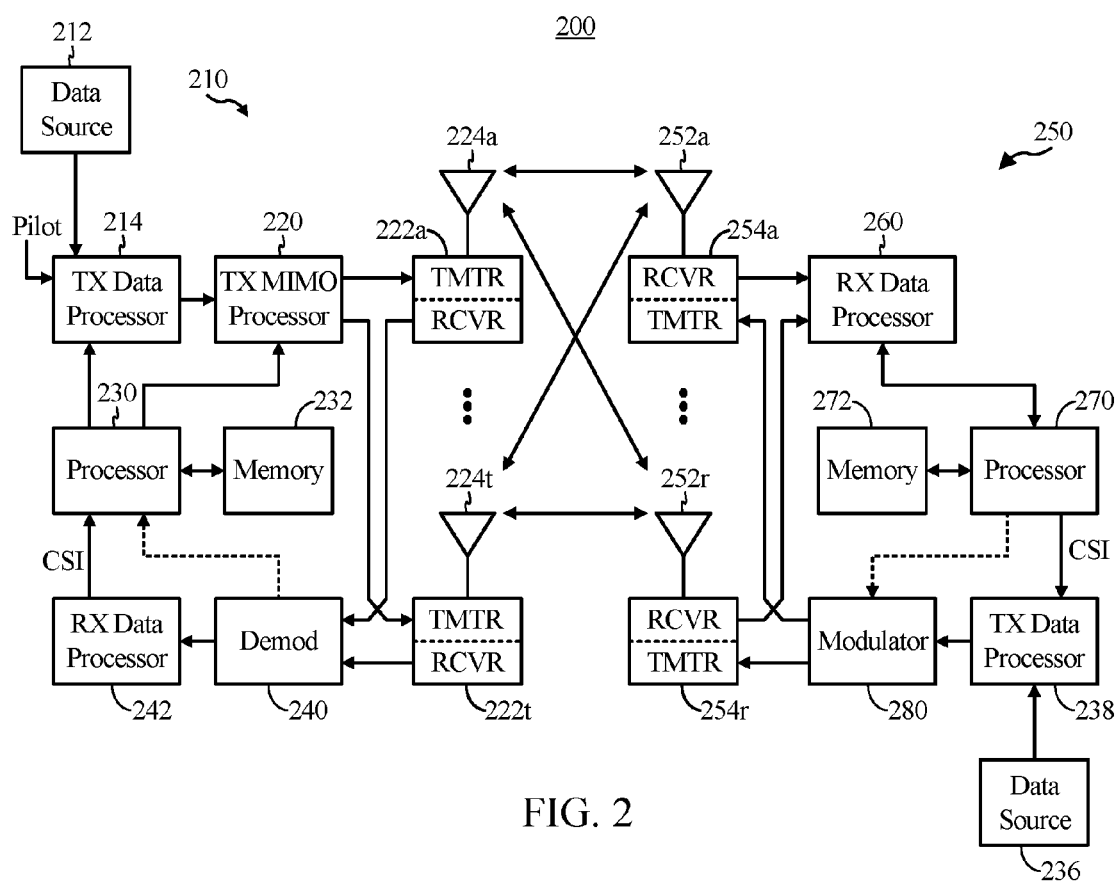
FIG. 2 illustrates a block diagram of an access point and a user terminal in accordance with certain aspects of the present disclosure.

FIG. 2 illustrates a block diagram of an aspect of a transmitter system 210 (e.g., also known as the access point/base station) and a receiver system 250 (e.g., also known as the access terminal) in a wireless communications system, for example, a MIMO system 200, in which aspects of the present disclosure may be practiced. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme selected for that data stream to provide coded data.

Coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QPSK, m-QPSK, or m-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals may be received by $N_R$ antennas 252a through 252r and the received signal from each antenna 252 may be provided to a respective receiver (RCVR) 254a through 254r. Each receiver 254 may condition (e.g., filters, amplifies, and down converts) a respective received signal, digitize the conditioned signal to provide samples, and further process the samples to provide a corresponding "received" symbol stream.

An RX data processor 260 then receives and processes the $N_R$ received symbol streams from $N_R$ receivers 254 based on a receiver processing technique to provide $N_T$ "detected" symbol streams. The RX data processor 260 then demodulates, deinterleaves, and decodes each detected symbol stream to recover the traffic data for the data stream. The processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. The reverse link message may comprise various types of information regarding the communication link and/or the received data stream. The reverse link message is then processed by a TX data processor 238, which also receives traffic data for several data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights, and then processes the extracted message.

Figure 3:
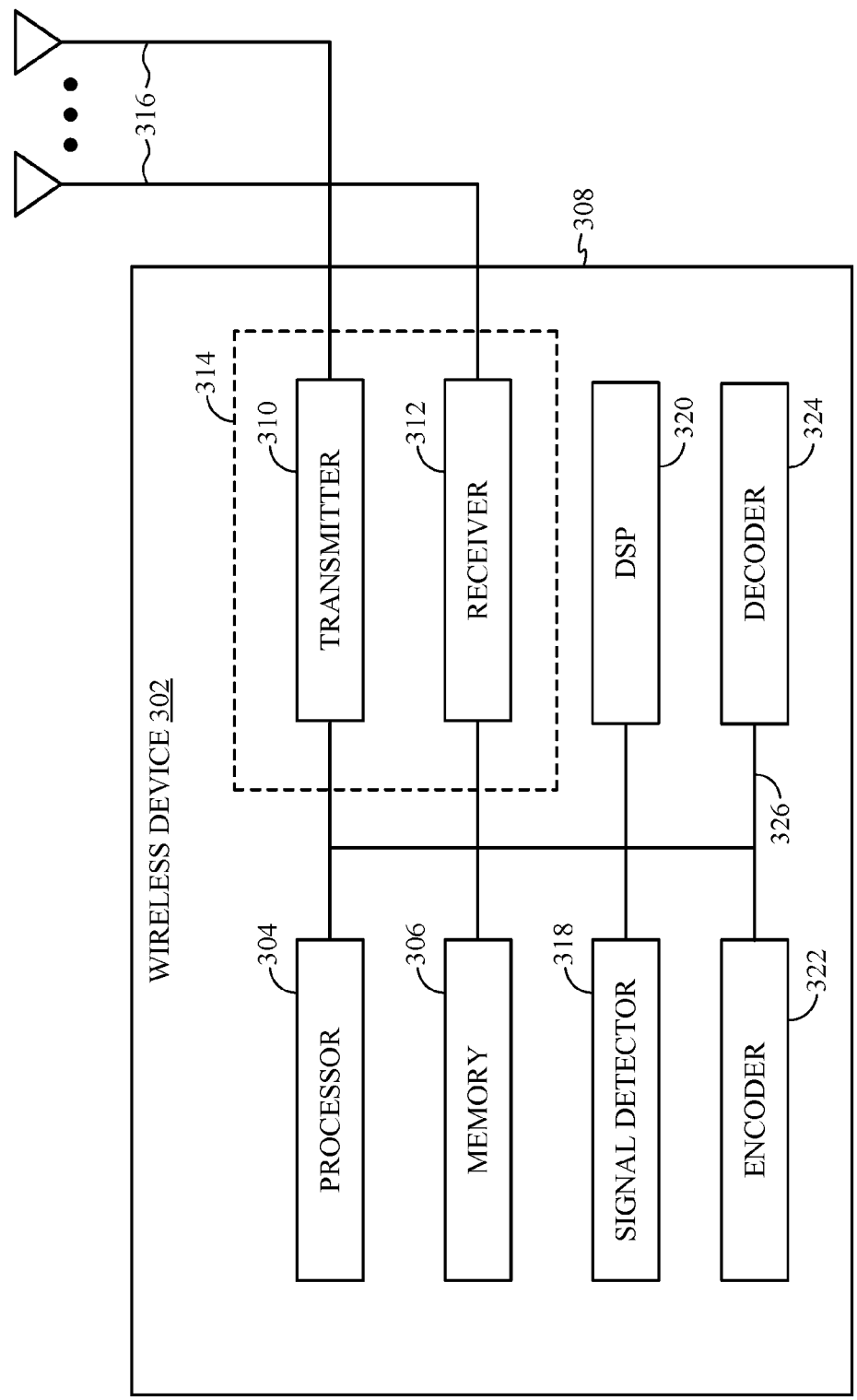
FIG. 3 illustrates a block diagram of an example wireless device in accordance with certain aspects of the present disclosure.

FIG. 3 illustrates various components that may be utilized in a wireless device 302 that may be employed within the wireless communication system from FIG. 1. The wireless device 302 is an example of a device that may be configured to implement the various methods described herein. For example, in some cases, the wireless communications device may be configured to obtain a payload to be transmitted, partition the payload into a plurality of sections, derive redundancy check information for each section of the plurality of sections, merge the redundancy check information for each section with the plurality of sections to form a sequence of bits, and generate a codeword by encoding the sequence of bits using an encoder, as described in greater detail below. In other cases, the wireless device may be configured to receive a codeword comprising a plurality of payload sections, decode the plurality of payload sections of the codeword, and verifying each decoded payload section of the plurality of payload sections based on redundancy check information corresponding to that decoded payload section, as described in greater detail below. According to certain aspects, the wireless device 302 may be an access point 100 from FIG. 1 or any of access terminals 116, 122.

The wireless device 302 may include a processor 304 which controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single, or a plurality of, transmit antennas 316 may be attached to the housing 308 and electrically coupled to the transceiver 314. The wireless device 302 may also include (not shown) multiple transmitters, multiple receivers, and multiple transceivers.

The wireless device 302 may also include a signal detector 318 that may be used to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

Additionally, the wireless device may also include an encoder 322 for use in encoding signals for transmission and a decoder 324 for use in decoding received signals. According to certain aspects, the encoder 322 may perform encoding according to certain aspects presented herein (e.g., by implementing operations 1100 illustrated in FIG. 11). Additional details of the encoder 322 will be described in greater detail below. According to certain aspects, the decoder 324 may perform decoding according to certain aspects presented herein (e.g., by implementing operations 1300 illustrated in FIG. 11). Additional details of the decoder 324 will be described in greater detail below.

The various components of the wireless device 302 may be coupled together by a bus system 326, which may include a power bus, a control signal bus, and a status signal bus in addition to a data bus. The processor 304 may be configured to access instructions stored in the memory 306 to perform connectionless access, in accordance with aspects of the present disclosure discussed below.

Figure 4:
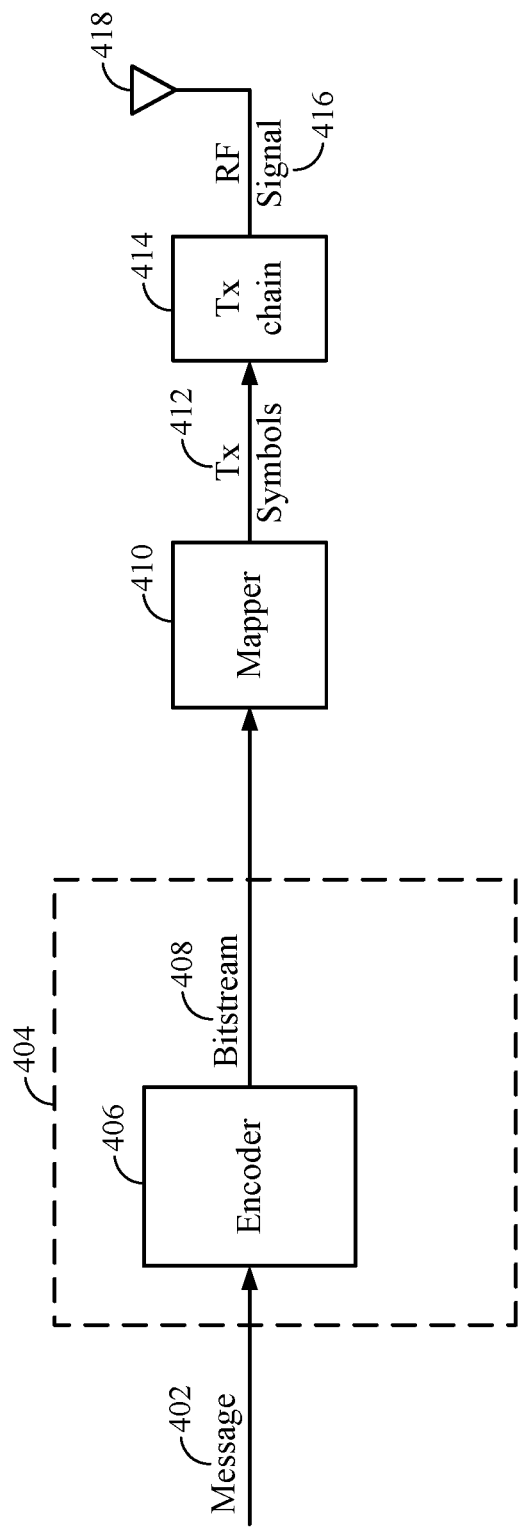
FIG. 4 is a block diagram illustrating a decoder, in accordance with certain aspects of the present disclosure.

FIG. 4 illustrates a portion of a radio frequency (RF) modem 404 that may be configured to provide an encoded message for wireless transmission. In one example, an encoder 406 in a base station (e.g., AP 100 and/or 210) (or an access terminal on the reverse path, such as 116 and/or 250) receives a message 402 for transmission. The message 402 may contain data and/or encoded voice or other content directed to the receiving device. The encoder 406 (which may correspond to the encoder 322 of the wireless device 302) encodes the message using a suitable modulation and coding scheme (MCS), typically selected based on a configuration defined by the base station 100/210 or another network entity.

In some cases, the encoder 406 may encode the message using techniques described below (e.g., by implementing operations 1100 illustrated in FIG. 11). For example, in some cases, the encoder 406 may obtain a payload to be transmitted, partition the payload into a plurality of sections, derive redundancy check information for each section of the plurality of sections, merge the redundancy check information for each section with the plurality of sections to form a sequence of bits, and generate a codeword (e.g., encoded bitstream 408) by encoding the sequence of bits, as described in greater detail below.

According to aspects, encoded bitstream 408 produced by the encoder 406 may then be provided to a mapper 410 that generates a sequence of Tx symbols 412 that are modulated, amplified and otherwise processed by Tx chain 414 to produce an RF signal 416 for transmission through antenna 418.

Figure 5:
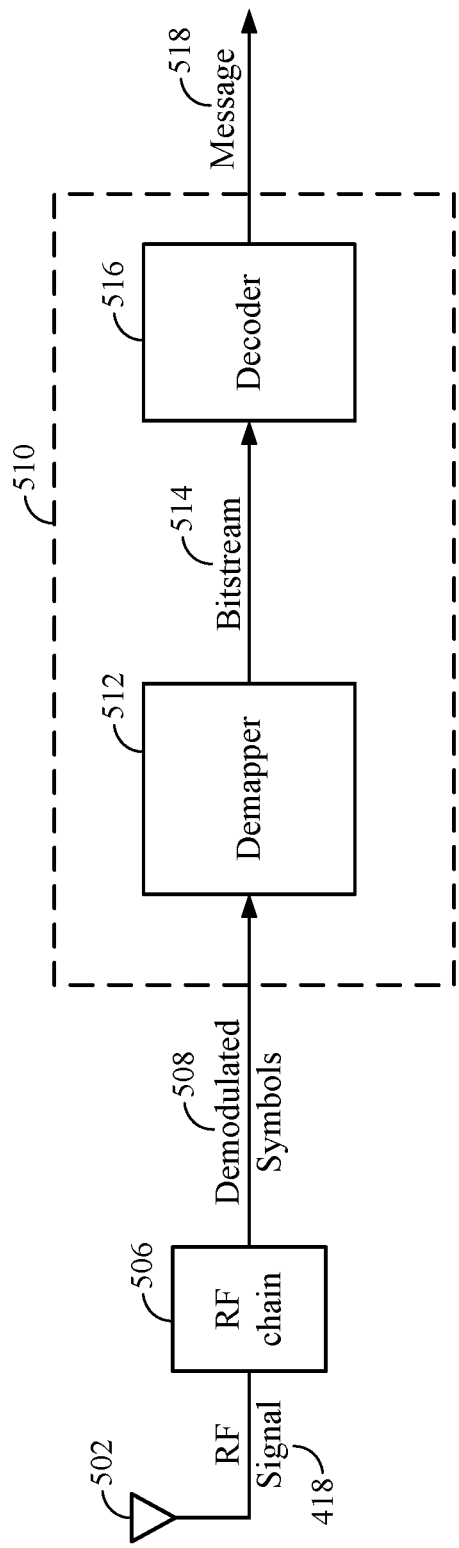
FIG. 5 is a block diagram illustrating a decoder, in accordance with certain aspects of the present disclosure.

FIG. 5 illustrates a portion of a RF modem 510 that may be configured to receive and decode a wirelessly transmitted signal including an encoded message (e.g., a message encoded using a tail biting convolutional code as described below). In various examples, the modem 510 receiving the signal may reside at the access terminal, at the base station, or at any other suitable apparatus or means for carrying out the described functions. An antenna 502 provides an RF signal 418 (i.e., the RF signal produced in FIG. 4) to an access terminal (e.g., access terminal 116, 122, and/or 250). An RF chain 506 processes and demodulates the RF signal 418 and may provide a sequence of symbols 508 to a demapper 512, which produces a bitstream 514 representative of the encoded message.

A decoder 516 (which may correspond to the decoder 324 of the wireless device 302) may then be used to decode m-bit information strings from a bitstream that has been encoded using a coding scheme (e.g., a TBCC encoding scheme, a Polar code encoding scheme, etc.). The decoder 516 may comprise a Viterbi decoder, an algebraic decoder, a butterfly decoder, or another suitable decoder. In one example, a Viterbi decoder employs the well-known Viterbi algorithm to find the most likely sequence of signaling states (the Viterbi path) that corresponds to a received bitstream 514. The bitstream 514 may be decoded based on a statistical analysis of LLRs calculated for the bitstream 514. In one example, a Viterbi decoder may compare and select the correct Viterbi path that defines a sequence of signaling states using a likelihood ratio test to generate LLRs from the bitstream 514. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 514. The decoder 516 may then decode the bitstream 514 based on the LLRs to determine the message 518 containing data and/or encoded voice or other content transmitted from the base station (e.g., AP 100 and/or 210). The decoder may decode the bitstream 514 in accordance with aspects of the present disclosure presented below (e.g., by implementing operations 1300 illustrated in FIG. 13). For example, in some cases, the decoder may a codeword comprising a plurality of sections, decode the plurality of sections of the code word, and verify each decoded section of the plurality of sections based on redundancy check information corresponding to that decoded section.

Figures 6, 7:
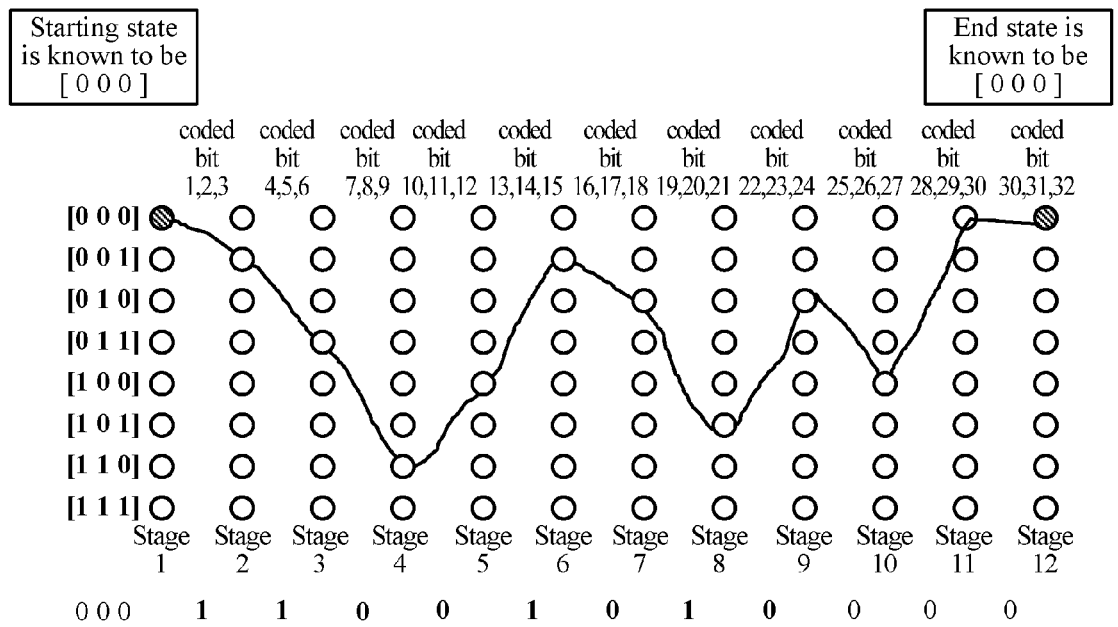
FIG. 6 illustrates an example of convolutional coding.
FIG. 7 illustrates an example of a Viterbi algorithm for decoding a convolutionally coded bit stream according to some embodiments.

According to certain aspects, a convolutional coding algorithm may be used to encode a stream of bits (e.g., as described with respect FIG. 4) and generate an encoded codeword. FIG. 6 illustrates an example of convolutional coding, in which a stream of information bits is encoded. As illustrated, the encoding may start with a known sequence of bits (e.g., 000 in this example) and each encoded bit may be generated as a function of the previous bits. The same known sequence of bits is appended at the end as shown in FIG. 6.

As illustrated in FIG. 7, an encoded codeword may be decoded using a Trellis structure. In a Trellis structure, each stage in the Trellis has one of several states (e.g., 8 states if each bit is encoded based on previous three bits). Each transition from one stage to the other is a function of the previous bits and a "new" payload bit being encoded. In the illustrated example, since the first bit is a "1" the transition is from the state "000" in the first stage to the state "001" in the second stage (then from the "001" state in the second stage to "011" in the third stage, etc.). Thus there are only a finite number of valid decoding paths through the Trellis as the validity of a decoding path is a function of the bits used for encoding (i.e., the previous bits and the "new" bit being encoded). While FIG. 7 illustrates a trellis structure with 8 states, it should be understood that trellis structures may contain any number of states depending on how many "previous bits" are used to encode a "new" payload bit.

As described above, and as illustrated in FIG. 7, starting state and ending state are both known, a fact that may be exploited when decoding (e.g., any decoding paths through the Trellis that do not begin and end with the known state can be disqualified). For example, with reference to FIG. 7, assuming that the starting state is known to be [000] (e.g., as illustrated), any decoding paths that do not end with an ending state of [000] may be automatically disqualified. For example, a decoding path with a starting state of [000] and an ending state of [111] may be disqualified.

Figure 8:
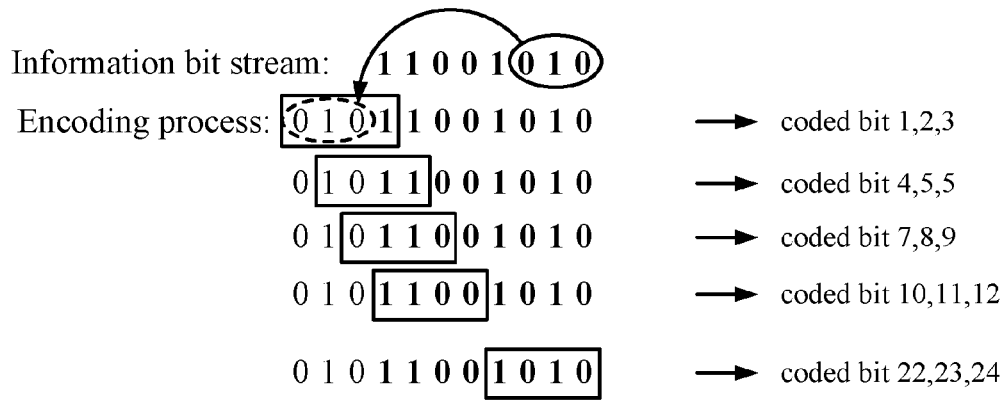
FIG. 8 illustrates an example of encoding via a tail biting convolutional code (TBCC) according to some embodiments.
Figure 9:
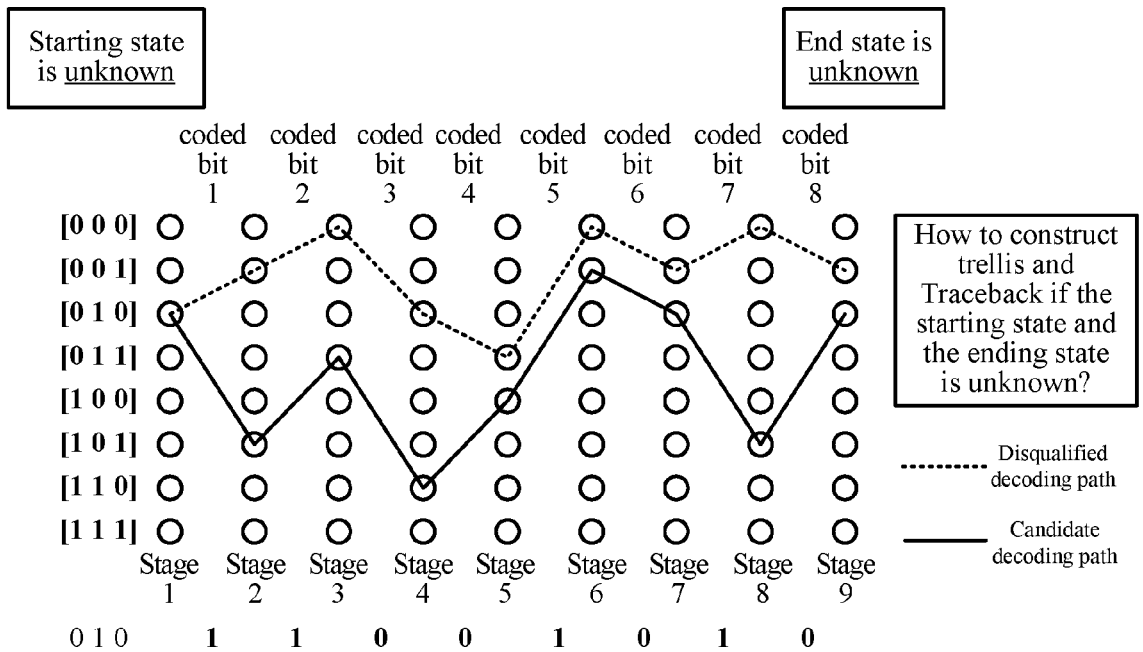
FIG. 9 illustrates an example of a Viterbi algorithm for decoding a TBCC encoded bit stream according to some embodiments.

FIG. 8 illustrates an example of encoding a stream of bits using a tail biting convolutional code (TBCC). The TBCC algorithm is named such because the "tail" end of the bits is appended to the start of the encoded bit stream, for example, as illustrated. Thus, in this case, the starting and ending states are the same (as in FIG. 7), but the state is not fixed (rather it depends on the value of the tail bits). In the illustrated example, the value of the tail bits (and thus starting and end states) is "010." Thus, as illustrated by the solid line in FIG. 9, since the first bit is a "1" the transition is from the starting state "010" in the first stage to the state "101" in the second stage (then from the "101" state in the second stage to "011" in the third stage, etc.). Using a TBCC decoding Trellis, as illustrated in FIG. 9, any decoding paths that do not begin and end at the same state (although initially unknown) may be disqualified. For example, assume again the starting state is "010". In this example, however, illustrated by the dashed line in FIG. 9, the starting state (i.e., "010") does not match the ending state (e.g., "001"). Thus, this decoding path may be disqualified.

Figure 10:
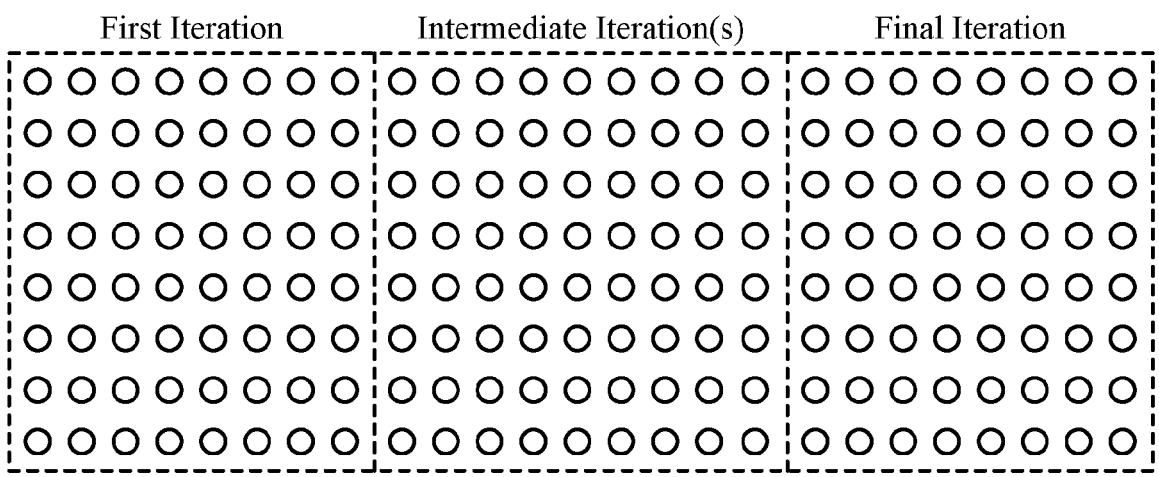
FIG. 10 illustrates an example iterative process of a Viterbi algorithm for decoding a TBCC encoded bit stream according to some embodiments.

As illustrated in FIG. 10, one algorithm for decoding a TBCC encoded codeword is through a series of iterations. For example, in a first iteration, a decoder (e.g., decoder 324 and/or 516) may begin constructing a decoding trellis having each state starting with an equal weight. At the end of the trellis construction (e.g., after a final iteration), the decoder 324 and/or 516 may identify a number of best states, then perform a back trace output over a certain range of stages for the decoded bits and select a decoding path based on metrics (e.g., such as the path metrics, tail byte check, etc.) generated during these iterations to derive decoded bits.

Example Polar Codes

As noted above, polar codes may be used to encode a stream of bits for transmission. Polar codes are the first provably capacity-achieving coding scheme with almost linear (in block length) encoding and decoding complexity. Polar codes are widely considered as a candidate for error-correction in the next-generation wireless systems. Polar codes have many desirable properties such as deterministic construction (e.g., based on a fast Hadamard transform), very low and predictable error floors, and simple successive-cancellation (SC) based decoding.

Polar codes are linear block codes of length $N=2^n$ where their generator matrix is constructed using the $n^{th}$ Kronecker power of the matrix $$G = \begin{pmatrix} 1 & 0 \\ 1 & 1 \end{pmatrix},$$

denoted by $G^n$. For example, Equation (1) shows the resulting generator matrix for n=3.

$$G^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Eq. 1}$$

According to certain aspects, a codeword may be generated (e.g., by a BS) by using the generator matrix to encode a number of input bits (e.g., information bits). For example, given a number of input bits $u=(u_0, u_1, \ldots, u_{N-1})$, a resulting codeword vector $x=(x_0, x_1, \ldots, x_{N-1})$ may be generated by encoding the input bits using the generator matrix G. This resulting codeword may then be rate matched (e.g., using techniques described herein) and transmitted by a base station over a wireless medium and received by a UE.

When the received vectors are decoded (e.g., by the UE) using a decoder (e.g., decoder 516), such as a Successive Cancellation (SC) decoder or successive cancellation list (SCL) decoder, every estimated bit, $\hat{u}_i$, has a predetermined error probability given that bits $u_0^{i-1}$ were correctly decoded, that tends towards either 0 or 0.5. Moreover, the proportion of estimated bits with a low error probability tends towards the capacity of the underlying channel. Polar codes exploit a phenomenon called channel polarization by using the most reliable K bits to transmit information, while setting, or freezing, the remaining (N−K) bits to a predetermined value, such as 0, for example as explained below.

For very large N, polar codes transform the channel into N parallel "virtual" channels for the N information bits. If C is the capacity of the channel, then there are almost N*C channels which are completely noise free and there are N(1−C) channels which are completely noisy. The basic polar coding scheme then involves freezing (i.e., not transmitting) the information bits to be sent along the completely noisy channel and sending information only along the perfect channels. For short-to-medium N, this polarization may not be complete in the sense there could be several channels which are neither completely useless nor completely noise free (i.e., channels that are in transition). Depending on the rate of transmission, these channels in the transition are either frozen or they are used for transmission.

Example Encoding and Decoding of Control Signaling with Sectional Redundancy Check In legacy communication standards that use convolutional coding (CC) and/or tail biting convolutional coding (TBCC) for encoding streams control signaling bits for transmission, a cyclic redundancy check (CRC) is typically included in the stream of pre-encoded control signaling bits to help detect errors in a decoded payload corresponding to the stream of pre-encoded control signaling bits. For example, given a stream of pre-encoded bits, a CRC may be calculated based on the stream of pre-encoded bits, known as a global CRC, and appended to the end of the stream of pre-encoded bits. The stream of pre-encoded bits, including the global CRC, may then be encoded using a particular encoding scheme (e.g., low-density parity check (LDPC), Polar Codes, tail-biting convolutional codes (TBCC), convolutional codes (CC), etc.), and the encoded codeword transmitted. On the receiving end, a receiver may receive and decode the codeword (e.g., in accordance with the particular encoding scheme used to encode the codeword), and may check whether the codeword was properly decoded based on the included CRC.

An N-bit cyclic redundancy check can naturally provide an expected false detection rate at $2^{-N}$. However, other than the decoding error detection provided by the global CRC (i.e., one CRC for the payload) (e.g., for block re-transmission in a hybrid automated repeat request (H-ARQ) process), the legacy approach fails to provide additional insights into error symptoms of a transmission, such as indicating "E" incorrectly decoded bits confined to a particular section of the codeword, as opposed to the same "E" number of incorrectly decoded bits sparsely distributed in the overall decoded codeword.

Thus, without changing total number of redundancy check bits and payload bits, aspects of the present disclosure present techniques for providing additional insights into decoding error symptoms of control signaling that could benefit the decoder by enabling certain sophisticated handling (e.g., trellis path pruning) to achieve improved code block error rate performance and/or decoding complexity reduction while maintaining unaffected overall false detection rates. That is, aspects of the present disclosure provide a new code structure that enables the use of error symptom insights to increase decoding performance and/or reduce decoding complexity, for example, by partitioning a payload (e.g., control signaling, data, etc.) into a plurality of payload sections and deriving redundancy check information for each of the control signaling payload sections.

Figure 11:
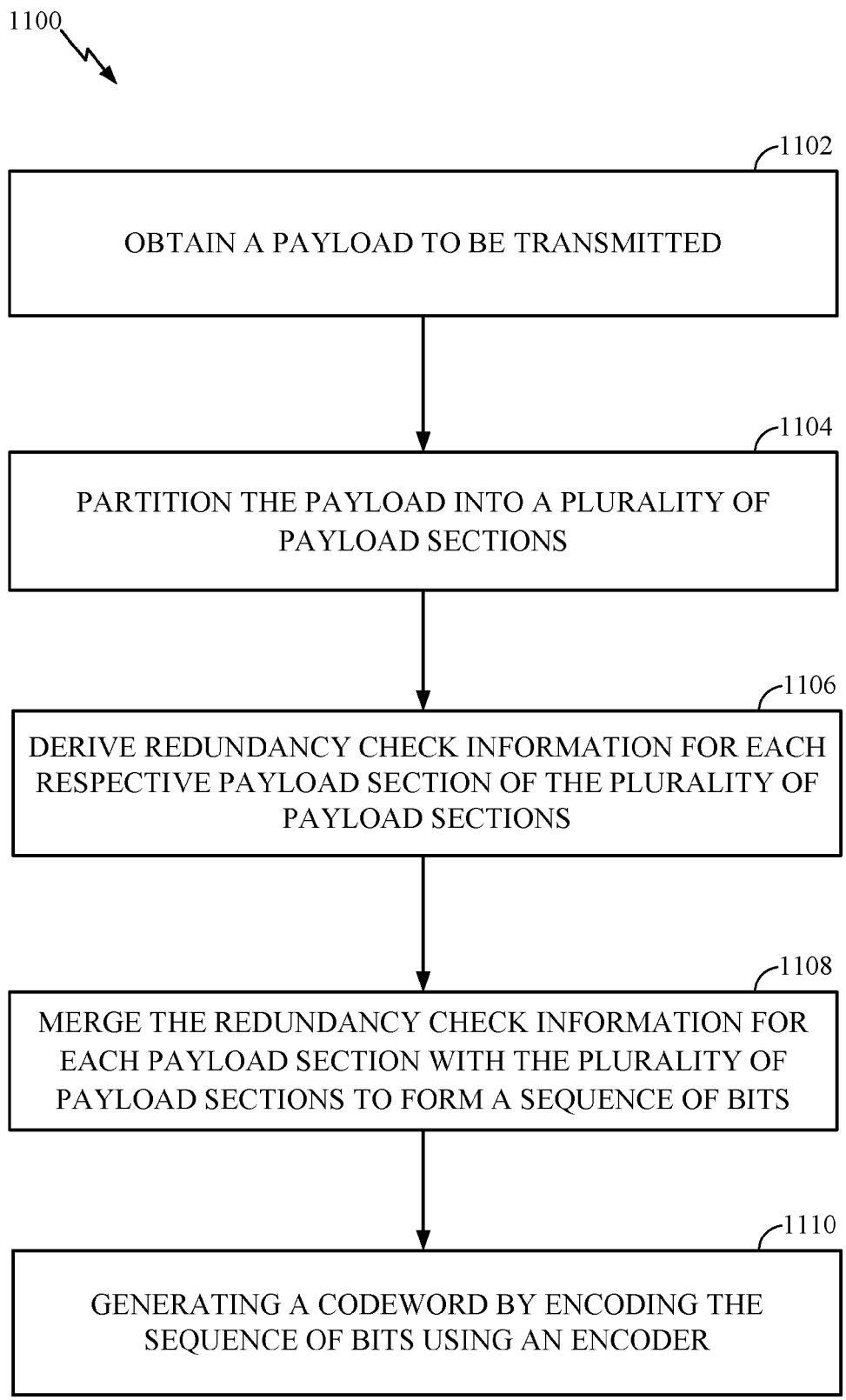
FIG. 11 illustrates example operations for wireless communications, in accordance with certain aspects of the present disclosure.

FIG. 11 illustrates example operations 1100 for wireless communications, for increasing decoding performance and/or reducing decoding complexity. These techniques can be applied for wireless transmission such as control signaling and/or data signaling in various scenarios as desired. According to certain aspects, operations 1100 may be performed by any suitable wireless transmission device, such as a base station (e.g., AP 100, 210), user terminal (e.g., AT 116, 250), and/or wireless device 302. The operations 1100 are shown for illustration yet may be ordered or supplemented in various manners as desired.

To implement operations 1100, various implementation arrangements can be utilized. For example, a wireless transmission device may include one or more components as illustrated in FIGS. 2 and 3. These components can be configured to perform the operations described herein. For example, the antenna 224, receiver/transmitter 222, TX data processor 214, processor 230, and/or memory 232 of the access point 210, as illustrated in FIG. 2, may perform the operations described herein. Additionally or alternatively, the antenna 252, receiver/transmitter 254, TX data processor 238, modulator 280, processor 270, and/or memory 272 of the access terminal 250, as illustrated in FIG. 2, may perform the operations described herein. Additionally or alternatively, one or more of the processor 304, memory 306, transceiver 314, DSP 320, encoder 322, decoder 324, and/or antenna(s) 516 as illustrated in FIG. 5 may be configured to perform the operations described herein.

Generally, the operations 1100 show a series of actions for efficient wireless communication. Operations 1100 begin at 1102 by obtaining a payload to be transmitted. At 1104, a wireless transmission device can partition the payload into a plurality of payload sections. Partitioning can involve segmenting one arrangement of information into sections; the number and size of partitions may vary as desired. At 1106, the wireless transmission device derives redundancy check information for each respective payload section of the plurality of payload sections. At 1108, the wireless transmission device merges the redundancy check information associated with or for each payload section with the plurality of payload sections. Merging them can yield a sequence of bits that represents the aggregated merged redundancy check information. Merging may also include combining bits in a variety of manners as desired so that resulting end result represents information input into a merging function. At 1110, the wireless transmission device generates a codeword by encoding the sequence of bits using an encoder. While not illustrated, operations 1100 may also include the wireless transmission device transmitting the codeword to a wireless reception device for decoding.

The partitioning as discussed above can occur in a variety of manners. As noted above, a payload (not always including CRC/parity information) may be first partitioned by a wireless transmission device into N payload sections. The N payload sections can range and vary in size, scope, detail, priority, importance, order, etc. Partitioning can yield a series of information to form a "P" (i.e., payload) sequence: {P0, P1, . . . , PN-1}. According to certain currently preferred aspects, in some cases, the payload may comprise control information bits/signaling. Yet in other aspects the payload may comprise other types of signaling or data as desired. In short, embodiments provide flexible arrangement for the lengths and locations for the sectional CRCs enabling dynamic and on-the-fly adjustments in desired scenarios.

Partitioned information bits can be used as a basis to derive error correction or redundancy check information. Derivation may generally include using information bits (i.e., one set of information) in some manner to produce or obtain other information (i.e., another second set of information). According to certain aspects, each payload section may then be used by the wireless transmission device to independently derive redundancy check information corresponding to that payload section. According to certain aspects, the redundancy check information may be used by a wireless reception device (e.g., a separate wireless device 302) during decoding to determine whether sections of a codeword are decoded properly, for example, as explained below in greater detail.

In some cases, the redundancy check information may comprise an error detection code. This can include as a "sectional" CRC also referred to as sectional decoded redundancy check (SDRC). In other cases, the redundancy check information may comprise one or more parity bits, for example, as described in greater detail below. In yet other cases, the redundancy check information may comprise information usable by a list decoder for determining one or more most-likely/correct decoding paths through trellis stages of the list decoder, known as sectional in-trellis redundancy check (SITRC).

According to certain aspects, a wireless transmission device may derive redundancy check information. This may be performed in an independent fashion (e.g., a sectional CRC, parity bit information, etc.) corresponding to each section of the P sequence to form a "C" (e.g., CRC) sequence {C0, C1, CN-1} of redundancy check information. According to aspects, the redundancy check information derived for each section may comprise one or more bits and may be of equal or unequal lengths. That is, in some cases, redundancy check information derived for a first section (e.g., P0) may comprise the same number or a different number of bits as redundancy check information derived for a second section (e.g., P1).

Figure 12:
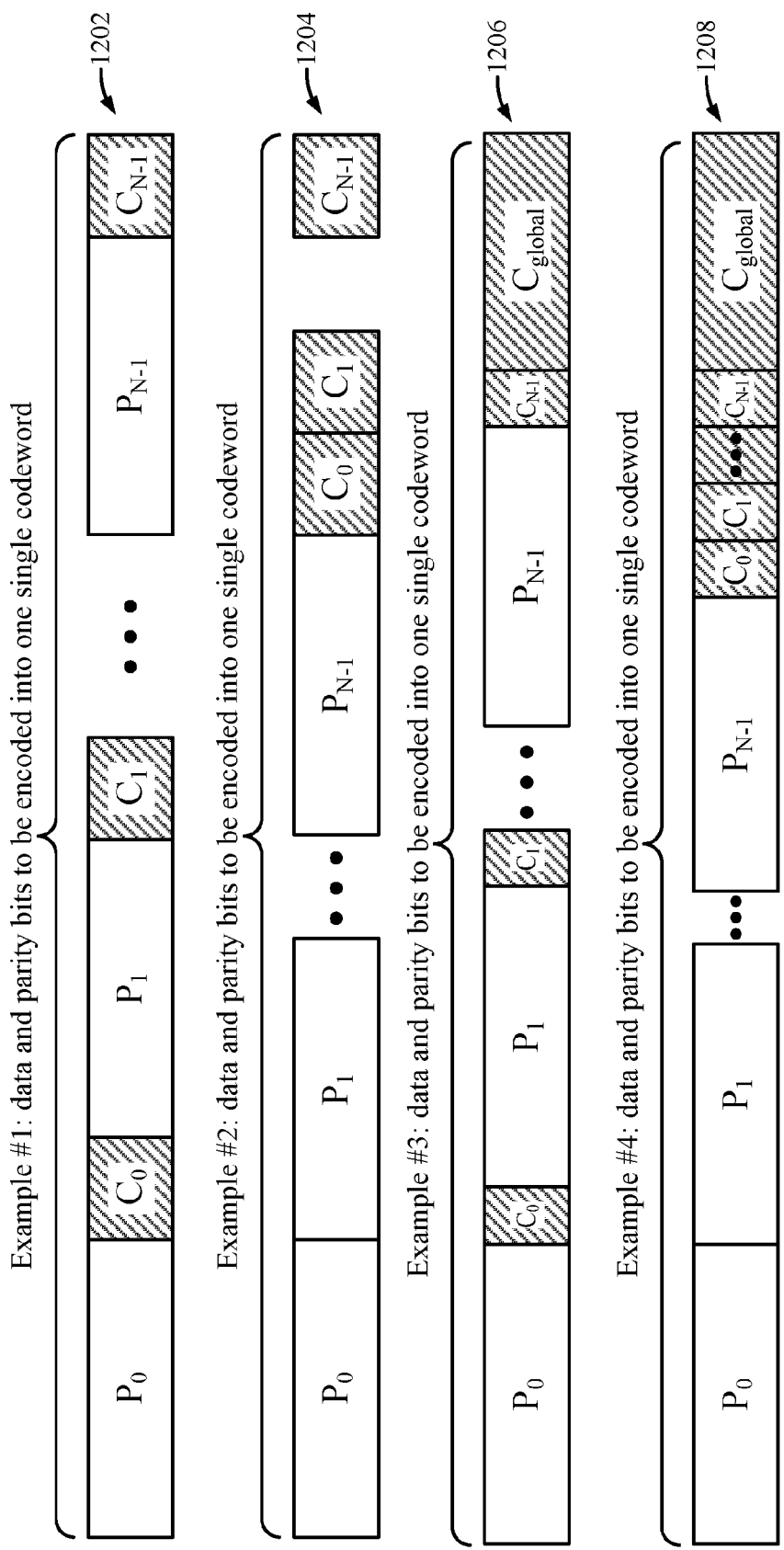
FIG. 12 illustrates exemplary interleaving/concatenation patterns for redundancy check information, in accordance with certain aspects of the present disclosure.

Additionally, in some cases, the wireless transmission device may derive a global CRC for a full payload, for example, as illustrated in FIG. 12. A global CRC can cover each section of the multi-sectional payload (i.e., the P sequence). The global CRC may be included in the C sequence according to some embodiments. In some cases, the global CRC may be derived from the multi-sectional payload combined with the sectional CRCs.

Additionally, according to certain aspects, other variations of sectional redundancy check information are possible. For example, in some cases, the sectional coverage of the redundancy check information may be defined such that {C0} of the C sequence covers {P0} of the P sequence and C1 of the C sequence covers {P0, P1} of the P sequence, and so on.

Further, in some cases, deriving redundancy check information may be performed for every 'X' number of payload sections. For example, according to a determined rate and a particular type of traffic or desired reliability of the traffic. For example, for ultra-reliable low-latency communications (URLLC) and/or mission critical (MiCr) type traffic, it may be desired to have redundancy check information derived and inserted into the URLLC/MiCr payload more often (e.g., to ensure reliability of the payload) than, say, traffic associated with internet browsing. Thus, the wireless transmission device may determine a rate for deriving/inserting redundancy check information into sections of payload, for example, based on a type of traffic or desired reliability of the traffic/payload. In some instances, it may be desired to omit or not utilize CRC segment information.

According to certain aspects, advantages of using techniques described herein are plenty. For example, an advantage of having sectional redundancy check information used in the manner described above (e.g., covering corresponding sections of the payload) is that a decoder of a wireless reception device (e.g., that receives a codeword comprising sectional redundancy check information) may determine whether individual sections of a codeword are received/decoded correctly. This is relative to other cases where a codeword only included a single 16-bit global CRC) and where the decoder could only determine that the entire payload was incorrectly received/decoded when the global CRC failed. Accordingly, knowledge regarding whether a particular section of the codeword was received/recoded improperly may allow the wireless reception device to transmit a request to the wireless transmission device to retransmit a particular section of codeword. Further, sectional redundancy check information enables a decoder to optionally perform additional processing/handling based on the knowledge for passing/failing of certain sections of payload.

According to certain aspects, the wireless transmission device may derive a sequence of bits that contains the payload sections (e.g., the P sequence) and the sectional and, if applicable, global redundancy check information (e.g., the C sequence) by applying a merging function, involving bit sequence arrangement such as insertion, interleaving, and concatenation, etc. Other merging functions may also be used as desired to accomplish producing representative merged CRC information.

According to certain aspects, the merging (e.g., interleaving/concatenation/insertion) may be performed according to one or more different patterns. For example, as illustrated at 1202, to form the new sequence, a first section of the payload, P0, may be concatenated with the corresponding sectional redundancy check information (e.g., $C_0$) for the first section of the payload, and the first section of payload and its corresponding sectional redundancy check information may then be concatenated to a second section of payload (e.g., $P_1$) and its corresponding sectional redundancy check information (e.g., $C_1$), etc. In some cases (e.g., at 1206), a global redundancy check information section (e.g., a global CRC) may be concatenated at the end of this new sequence.

According to aspects, sizes of CRC information can vary, and thus, as one example, sizes of sectional redundancy check information may also vary. In some cases, this variance in size may be based on whether a global redundancy check information section is included. For example, if a global redundancy check information section, the sectional redundancy check information (e.g., $C_0$ and $C_1$) may comprise more bits than if a global redundancy check information section is included. Further, in some cases, the size of each redundancy check information section may vary from section to section. For example, in some cases, $C_0$ may be larger or smaller (i.e., comprise more or less bits) than $C_1$. Additionally, in some cases, the size of a redundancy check information section corresponding to a section of payload may be zero (e.g., this section of payload does not have redundancy check information).

In some cases, an interleaving/concatenation pattern may be pre-defined for a merged sequence. This can include scenarios where a payload section is not immediately followed by a corresponding sectional redundancy check information (e.g., $P_0$ is not immediately followed by $C_0$). An interleaving/concatenating pattern may be advantageous since, in some cases, at a receiver, a single error symptom may impact up to K consecutive bits. Thus it may be beneficial to separate $P_0$ and its corresponding $C_0$ such that a single error symptom would not span across to both $P_0$ and $C_0$.

In some cases, to form a new or merged sequence, payload sections can be variously handled. For example, each section of payload may be concatenated together to form a sectional payload portion (e.g., $P_0$-$P_{N-1}$) and a sectional redundancy check information for each section may be concatenated on the end of the sectional payload portion. For example, as illustrated at 1204, this shows a resulting merged sequence formed from individualized treatment of sections. In some cases (e.g., at 1208), a global CRC may be concatenated at the end of this new sequence.

Regarding the interleaving/concatenation pattern(s) (e.g., as described above), certain choices of pattern may create separation in the sequence between $P_k$ and $C_k$ for a given k. This separation may be essential for redundancy check information error detection due to a relationship between code constraint length and the typical bit length of one single error symptom. In other words, the interleaving/concatenating pattern may be based on a relationship between a code constraint length and a bit length of a defined error symptom. For example, the constraint length of a TBCC may have a property in that a single error event may extend to no more than the constraint length of the decoded bits, as the linear-feedback shift register memory of the decoder may be "flushed out" regarding that single error beyond the constraint length. Thus, in some cases, redundancy check information (e.g., a CRC) of size "C" can guarantee detection of one or more decoding errors that do not amount to more than "C" bits. However, in some cases, for errors that amount to more than "C" bits, error detection may not be guaranteed.

Bit numbers used for sectional redundancy check information (e.g., sectional CRCs) may be the same as in the legacy case in some arrangements. This can include for example cases of only having a global CRC and no sectional CRCs. For example, in the legacy case the global CRC may comprise 16 bits. Here, with reference to the example concatenation illustrated at 1208, assuming the number of sections for pre-encoded data or CRC is 2 (i.e., two sections), the two sectional CRCs (e.g., $C_0$ and $C_1$) may comprise 6 bits and the single global CRC (e.g., $CRC_{Global}$) may comprise 4 bits. Thus, the total number of bits used for the sectional/global CRCs is still 16 bits.

According to certain aspects, the resultant merged sequence of bits (i.e., the merged P and C sequences) may then be encoded, by the wireless transmission device using an encoder (e.g., such as the encoder illustrated in FIG. 5), into one single codeword. According to aspects, the encoder may encode the merged sequence of bits using a convolutional code (CC) encoding scheme, tail biting convolutional code (TBCC) encoding scheme, or any other suitable coding scheme (e.g., Polar codes).

The codeword may then be transmitted by the wireless transmission device over a wireless medium and received by a wireless reception device for decoding, for example, as explained below.

Figure 13:
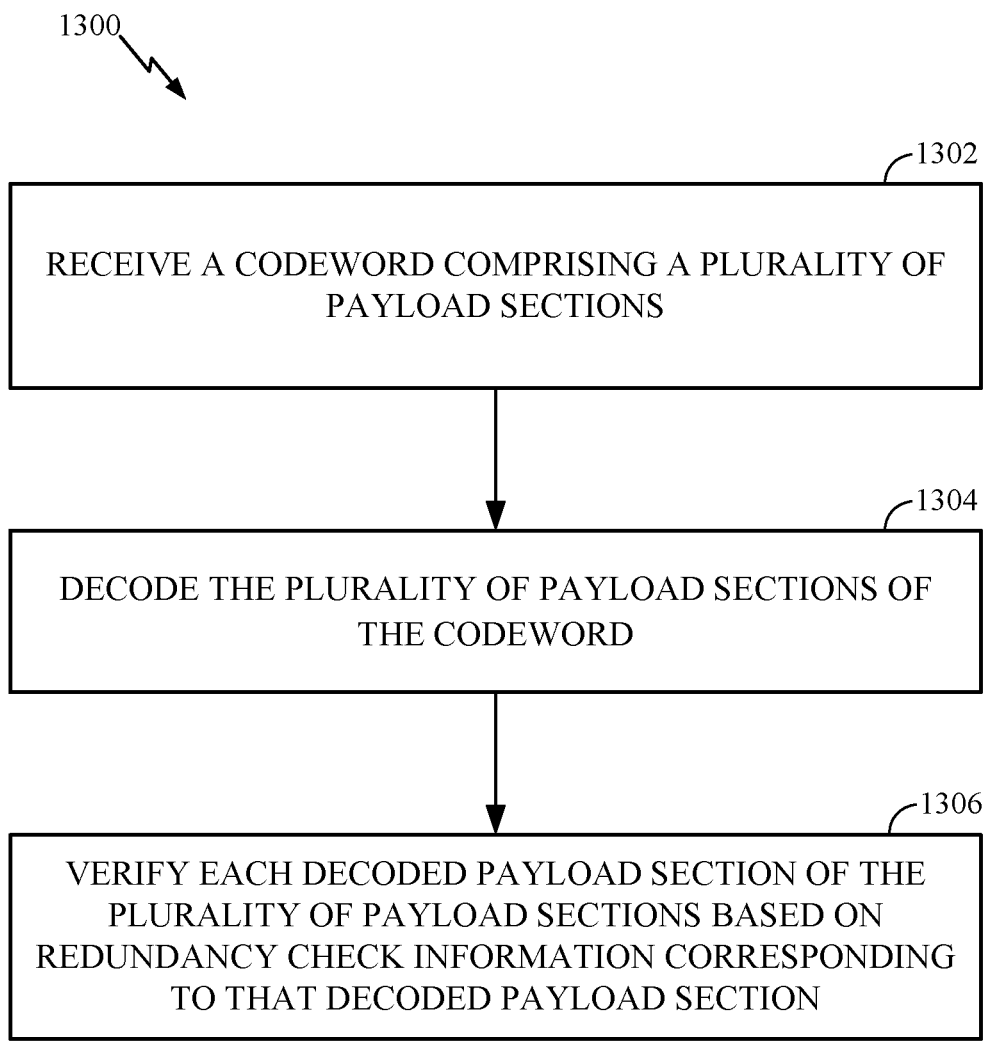
FIG. 13 illustrates example operations for wireless communications, in accordance with certain aspects of the present disclosure.

FIG. 13 illustrates example operations 1300 for wireless communications, for example, for increasing decoding performance and/or reducing decoding complexity, in accordance with certain aspects of the present disclosure. According to certain aspects, operations 1300 may be performed by any suitable wireless reception device, such as a base station (e.g., AP 100, 210), access terminal (e.g., AT 116, 250), and/or wireless device 302.

The wireless reception device may include one or more components as illustrated in FIGS. 2 and 3 which may be configured to perform the operations described herein. For example, the antenna 224, receiver/transmitter 222, TX data processor 214, processor 230, and/or memory 232 of the access point 210, as illustrated in FIG. 2, may perform the operations described herein. Additionally or alternatively, the antenna 252, receiver/transmitter 254, TX data processor 238, modulator 280, processor 270, and/or memory 272 of the access terminal 250, as illustrated in FIG. 2, may perform the operations described herein. Additionally or alternatively, one or more of the processor 304, memory 306, transceiver 314, DSP 320, encoder 322, decoder 324, and/or antenna(s) 516 as illustrated in FIG. 5 may be configured to perform the operations described herein.

According to certain aspects, operations 1300 may be complimentary to the operations 1100. For example, operations 1100 may be performed by wireless transmission device for generating (and transmitting) a codeword and operations 1300 may be performed by a wireless reception device for receiving and decoding the codeword.

Operations 1300 begin at 1302 by receiving a codeword comprising a plurality of payload sections. At 1304, the wireless reception device decodes the plurality of payload sections of the codeword. At 1306, the wireless reception device verifies each decoded payload section of the plurality of payload sections based on redundancy check information corresponding to that decoded payload section.

As noted above, the redundancy check information may comprise error correction codes, such as sectional CRCs, derived for different sections of a payload. According to certain aspects, the wireless reception device may decode the received codeword, comprising a plurality of sections, and may verify that each section of the decoded codeword was decoded correctly based on a sectional CRC for each section. Additionally, in some cases, the wireless reception device may verify the decoded codeword based on a global CRC included in the codeword.

As noted above, in some cases, the redundancy check information comprises parity information (e.g., a single parity bit). This information may be derived from, at least one of, state information or path information. State information or path information can be based on trellis stages of a list decoder in the wireless reception device.

In some cases, the wireless reception device may decode the received codeword based on a technique called sectional in-trellis redundancy check (SITRC), which uses information (i.e., the redundancy check information) in the codeword for determining one or more most-likely/correct decoding paths of sections of a codeword through trellis stages of a list decoder in the wireless reception device.

According to certain aspects, generating a codeword with redundancy check information comprising SITRC information may be similar to generating a codeword with SDRC information (i.e., sectional CRCs). One difference may be that sectional CRCs may be replaced with sectional path or state derivation logic (i.e., the information for determining one or more most-likely/correct decoding paths) for each section of the codeword. In other words, the redundancy check information for SITRC may comprise the sectional path or state derivation logic for each section of the codeword.

Figure 14:
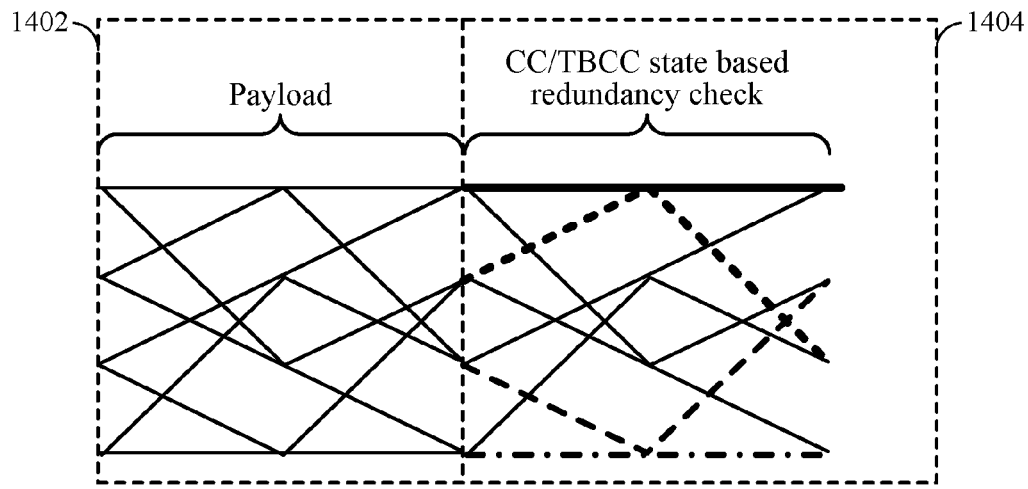
FIG. 14 illustrates an example 4-state CC/TBCC with redundancy check, in accordance with certain aspects of the present disclosure.

FIG. 14 illustrates a 4-state CC/TBCC with SITRC derived from an ending memory state, according to certain aspects of the present disclosure. For example, as illustrated in FIG. 14, SITRC may involve, during decoding of a section of a codeword, the wireless reception device determining a list of possible decoding paths through trellis stages of a list decoder for the first section (e.g., by using the decoding techniques described above), for example, as illustrated at 1402. The wireless reception device may then prune, based on the redundancy check information (e.g., sectional path or state derivation logic), the list of possible decoding paths to determine a list of most-likely/correct decoding paths for the first section, for example, as illustrated at 1404. For example, if a particular decoding path in the list of possible decoding paths for a particular section of payload fails to satisfy the redundancy check information (e.g., fails a CRC), this particular decoding path may be pruned (e.g., discarded).

According to certain aspects, the list of most-likely/correct decoding paths (e.g., those satisfying the redundancy check information/passing a CRC) may then be used to decode the codeword and verify the decoded sections. In some cases, a trellis quality of the list decoder may be improved by allowing these CRC-passing decoding path candidates to utilize the resources (e.g., states and stages) available in trellis. For example, assume an intermediate section of payload fails its sectional CRC and its preceding and subsequent neighbor sections are both pass their respective sectional CRCs. Now, according to aspects, with the knowledge and confidence that the two neighboring sections pass their sectional CRCs, the intermediate failing section can directly take advantage of the state knowledge of the sections which passed their CRCs, for example by using the state information for the passing section as the starting state and ending state of the failed intermediate section. Accordingly, in some cases, the decoder may use this information to try to re-decode the failing intermediate section.

In some cases, during decoding, if the wireless reception device determines that, for a particular section of the codeword, that there are no likely decoding paths (e.g., all decoding paths have been pruned from the list of possible decoding paths), the wireless reception device may terminate decoding early since no decoding paths will result in the codeword being properly decoded. According to aspects, this early termination reduces decoding complexity and power consumption as the decoder does not need to try to decode a codeword that will ultimately be undecodeable due to no decoding paths surviving.

According to certain aspects, such SITRC may be achieved by taking input from sectional payload CC/TBCC memory state or trellis path info, for example, a pre-defined function, such as: sectional_redundancy_check=f(sectional_payload_memory_state_or_trellis_path_info), for example, as illustrated in FIG. 14.

Figure 15:
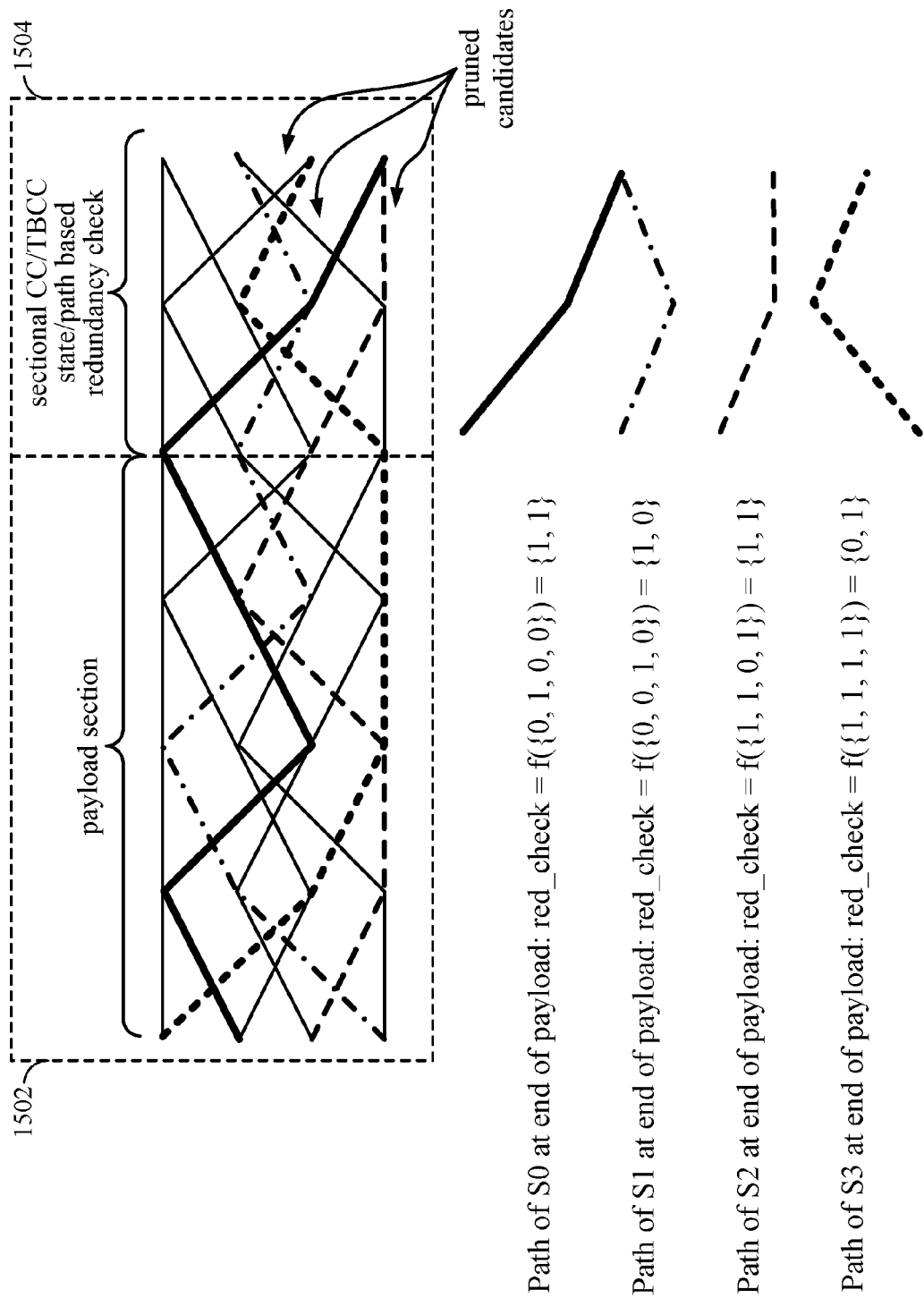
FIG. 15 illustrates an example 4-state CC/TBCC with redundancy check, in accordance with certain aspects of the present disclosure.

FIG. 15 illustrates a 4-state CC/TBCC with SITRC derived from a 2-bit CRC (X2+X1+1) over trellis path bits, according to certain aspects of the present disclosure. For example, as illustrated, during decoding of a payload section of a codeword, a wireless reception device may determine a list of possible decoding paths through trellis stages of a list decoder for the first section, for example, as illustrated at 1402. The wireless reception device may then prune the list of possible decoding paths based on state information or path information for that payload section to determine a list of most-likely/correct decoding paths for that payload section. As noted above, if no decoding paths survive pruning (e.g., all decoding paths are pruned), the wireless reception device may terminate decoding early.

According to certain aspects, a primary advantage of SITRC compared to SDRC relates to application of CRC data. For example, a decoder can benefit in that redundancy check knowledge may be directly applied during decoder trellis construction by quantitatively reflecting redundancy check in the state metrics used to decode the codeword. This enables the decoder to make an effort to always find a number of most-likely/correct path candidates prior to deriving decoded bits. SDRC, however, would require a complete decoding procedure before the decoded redundancy check can be applied.

According to aspects, SDRC provides certain benefits when used with Polar codes. For example, Polar decoding (SC/SCL) may be performed sequentially on info bits (u0, u1, u2, . . . ) (described above), and the decoded info bits with lower indices may be derived and checked earlier than those with higher indices. According to aspects, by applying SDRC in Polar codes, in order to support multiple information priorities, a section of payload and its corresponding sectional CRC may cover higher priority info, while other sections of payload (and their corresponding CRC) may cover lower priority info. For example, a payload may often consist of multiple parameter fields, which may or may not be of equal priority in terms of application timing. Assuming each parameter fields also comes with a corresponding sectional CRC, after decoding a first section of payload and ensuring its corresponding CRC passes, and before decoding of a second section of payload is even started, the decoded result for the first section of payload may already be used by other modem modules. Such priority scheme is possible with Polar codes, as decoding is highly sequential.

According to aspects, applications of such sectional CRC (e.g., in Polar codes) include enhanced mobile broadband (eMBB), certain downlink control (DCI) information, such as resource block (RB) allocation, may be more time critical as it is needed for demodulation reference signal (DMRS) channel estimation/equalization at the demodulator front end (DEM Front), while other DCI fields (such as modulation and coding scheme (MSC) or new data indicator (NDI)) may not be as time critical as they are used only at demodulator back end (DEM Back). Without sectional CRC, such type of multi-priority signaling may not be easily supported.

In some cases, a particular section of a codeword may not be properly decoded. For example, during the verification process, the wireless reception device may determine that one or more sections of the codeword were not decoded properly based on the redundancy check information. In some cases, if the wireless reception device determines that one or more sections of the codeword are not decoded properly, the wireless reception device may transmit a request (e.g., to the wireless transmission device), requesting a re-transmission of those one or more improperly decoded sections. In other cases, the wireless reception device may perform a more advanced decoding operation, using information that the one or more sections section were not properly decoded, to try to decode the one or more sections. For example, the wireless reception device may try to decode the codeword using a higher-performance, higher-complexity decoding algorithm (e.g., a decoder with a larger list size).

Additionally, while aspects of the present disclosure describe using sectional redundancy check information with TBCC/CC encoding schemes, it should be noted that the techniques presented above may also be used with other encoding schemes, such a Polar codes.

Figure 16:
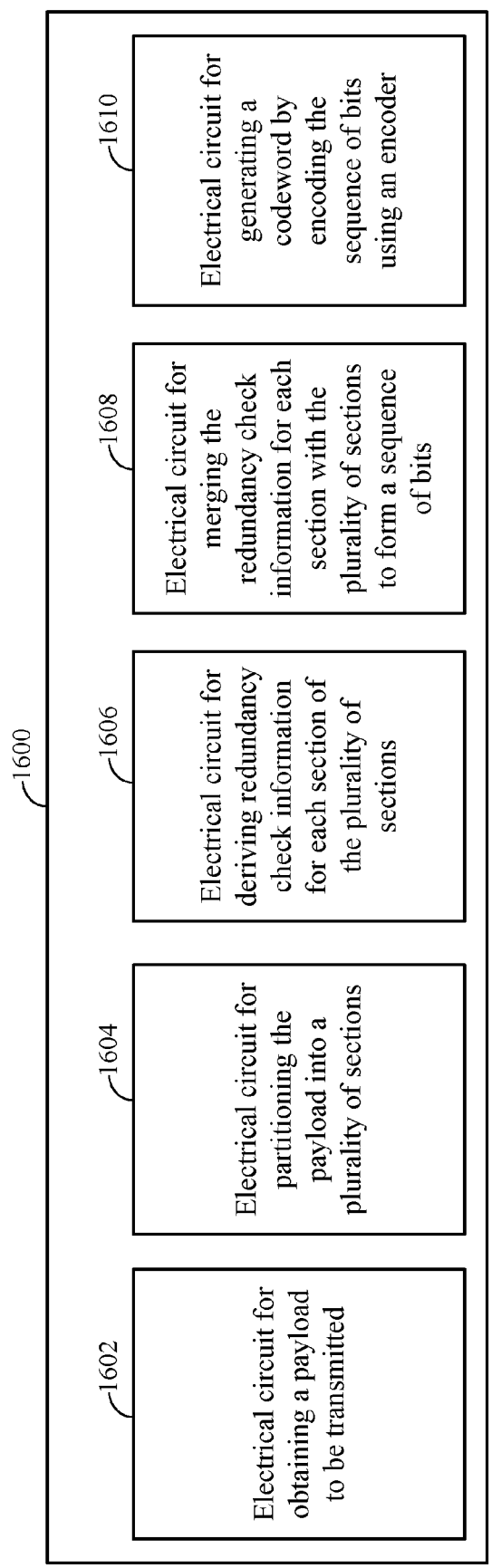
FIG. 16 illustrates an encoder configured to perform enhanced TBCC list decoding, in accordance with aspects of the present disclosure.

FIG. 16 illustrates a encoder 1600 configured to encode a payload, in accordance with aspects of the present disclosure. According to aspects, the encoder 1600 may comprise the encoder 322 and/or the encoder 406. As illustrated, the encoder 1600 comprises a number of electrical circuits configured to perform, for example, the operations 1100 illustrated in FIG. 11. For example, the encoder 1600 includes an electrical circuit 1602 for obtaining a payload to be transmitted. Additionally, the decoder 1600 includes and electrical circuit 1604 for partitioning the payload into a plurality of payload sections. Additionally, the decoder 1600 includes and electrical circuit 1606 for deriving redundancy check information for each respective payload section of the plurality of payload sections. Additionally, the decoder 1600 includes and electrical circuit 1608 for merging the redundancy check information for each payload section with the plurality of payload sections to form a sequence of bits. Additionally, the decoder 1600 includes and electrical circuit 1610 for generating a codeword by encoding the sequence of bits using an encoder.

Figure 17:
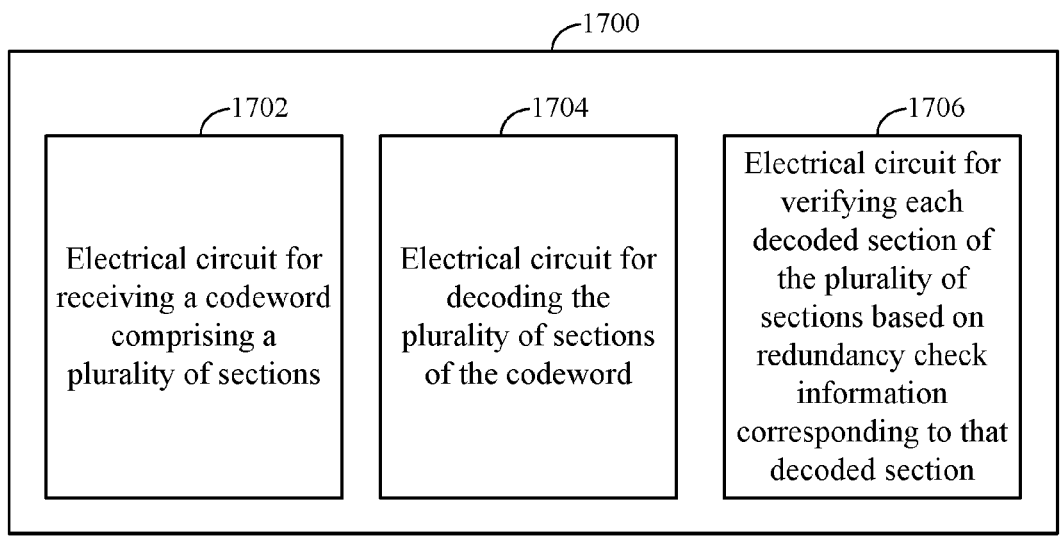
FIG. 17 illustrates a decoder configured to perform enhanced TBCC list decoding, in accordance with aspects of the present disclosure.

FIG. 17 illustrates a decoder 1700 configured to decode a codeword encoded using techniques presented herein, in accordance with aspects of the present disclosure. According to aspects, the decoder 1700 may comprise the decoder 324 and/or the decoder 516. As illustrated, the decoder 1700 comprises a number of electrical circuits configured to perform, for example, the operations 1300 illustrated in FIG. 13. For example, the decoder 1700 includes an electrical circuit 1702 for receiving a codeword comprising a plurality of payload sections. Additionally, the decoder 1700 includes and electrical circuit 1704 for decoding the plurality of payload sections of the code word. Additionally, the decoder 1700 includes and electrical circuit 1706 for verifying each decoded payload section of the plurality of payload sections based on redundancy check information corresponding to that decoded payload section.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application specific integrated circuit (ASIC), or processor.

For example, means for processing, means for generating, means for obtaining, means for partitioning, means for determining, means for deriving, means for merging, means for verifying, means for concatenating, means for interleaving, means for decoding, and means for encoding may comprise a processing system, which may include one or more processors, such as the TX data processor 214, the processor 230, and/or the RX data processor 242 of the access point 210 illustrated in FIG. 2 or the TX data processor 238, the processor 270, and/or the RX data processor 260 of the access terminal 250 illustrated in FIG. 2. Additionally, means for transmitting and means for receiving may comprise a TMTR/RCVR 222 of the access point 210 or a TMTR/RCVR 252 of the access terminal 250.

According to certain aspects, such means may be implemented by processing systems configured to perform the corresponding functions by implementing various algorithms (e.g., in hardware or by executing software instructions) described above.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and/or write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and BLU-RAY® media disc where disks usually reproduce data magnetically, while discs reproduce data optically with lasers. Combinations of the above should also be included within the scope of computer-readable media.

As used herein, a phrase referring to "at least one of" a list of items refers to any combination of those items, including single members. As an example, "at least one of: a, b, or c" is intended to cover: a, b, c, a-b, a-c, b-c, and a-b-c.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of wirelessly transmitting data in accordance with a radio technology, comprising:
   obtaining, by an encoder of a wireless transmission device, a payload to be transmitted;
   partitioning, by the encoder, the payload into a sequence of one or more payload sections;
   for each respective payload section in the sequence of one or more payload sections:
   deriving, by the encoder, sequential redundancy check information corresponding to all payload sections in the sequence of one or more payload sections starting from a first payload section to the respective payload section;
   merging, by the encoder, the respective payload section and the sequential redundancy check information corresponding to the respective payload section with a sequence of bits;
   generating, via the encoder, a codeword by encoding the sequence of bits for transmission; and
   transmitting, via a transmitter of the wireless transmission device, the codeword across a wireless channel in accordance with the radio technology.

2. The method of claim 1, further comprising: interleaving, by the encoder, the respective payload section and the corresponding sequential redundancy check information in the sequence of bits.

3. The method of claim 1, further comprising: concatenating, by the encoder, the respective payload section and the corresponding sequential redundancy check information to the sequence of bits.

4. The method of claim 1, further comprising:
   deriving, by the encoder, a global error detection code based on the sequence of one or more payload sections; and
   merging the global error detection code with the sequence of bits.

5. The method of claim 1, wherein the sequential redundancy check information comprises one of a cyclic redundancy check (CRC), parity information, or information usable by a list decoder for determining one or more correct decoding paths through trellis stages of the list decoder.

6. The method of claim 1, wherein the codeword is encoded using a tail biting convolutional code (TBCC) encoding scheme or a convolutional code (CC) encoding scheme, and wherein the payload comprises control information.

7. The method of claim 1, wherein a size of the sequential redundancy check information for a first payload section of the sequence of one or more payload sections is different than a size of the sequential redundancy check information for a second payload section of the sequence of one or more payload sections.

8. The method of claim 1, wherein encoding the sequence of bits for transmission by the encoder comprises encoding the sequence of bits with a Polar code encoding scheme.

9. A method of wirelessly receiving data in accordance with a radio technology, comprising:
   receiving, by a receiver of a wireless reception device, a codeword from a wireless channel in accordance with the radio technology;
   decoding, by a decoder of the wireless reception device, the codeword to obtain a sequence of bits, wherein the sequence of bits comprises:
   a sequence of one or more payload sections; and
   sequential redundancy check information; and
   verifying, by the decoder, for each respective payload section in the sequence of one or more payload sections, sequential redundancy check information corresponding to all decoded payload sections in the sequence of one or more payload sections starting from a first decoded payload section to the respective payload section.

10. The method of claim 9, wherein the sequence of one or more payload sections are interleaved with the sequential redundancy check information in the sequence of bits.

11. The method of claim 9, wherein the sequential redundancy check information corresponding to each respective payload section of the sequence of one or more payload sections is concatenated to the end of the respective payload section in the sequence of bits.

12. The method of claim 9, further comprising: verifying, by the decoder, all of the decoded payload sections based on a global error detection code included in the sequence of bits.

13. The method of claim 9, wherein the sequential redundancy check information comprises one of a cyclic redundancy check (CRC), parity information, or information usable by a list decoder for determining one or more correct decoding paths through trellis stages of the list decoder used to decode the codeword.

14. The method of claim 9, further comprising:
determining, based on the verifying by the decoder, that a first payload section of the sequence of one or more payload sections was not properly decoded; and at least one of:
transmitting a request for retransmission of the first payload section; or
performing an advanced decoding operation, using information that the first payload section was not properly decoded and a larger decoding list size, to try to decode the first payload section.

15. The method of claim 9, further comprising:
determining, for a first payload section of the sequence of one or more payload sections of the codeword, a list of possible decoding paths through a plurality of trellis stages of a list decoder for the first payload section; and
pruning, based on sequential redundancy check information corresponding to the first payload section, the list of possible decoding paths to determine a list of correct decoding paths for the first payload section.

16. The method of claim 15, further comprising: decoding, by the decoder, the first payload section based, at least in part, on the list of correct decoding paths for the first payload section.

17. The method of claim 15, further comprising terminating, by the decoder, decoding early if all of the possible decoding paths for the first payload section are pruned.

18. The method of claim 9, wherein the codeword is decoded by the decoder using a tail biting convolutional code (TBCC) encoding scheme or a convolutional code (CC) encoding scheme, and wherein the codeword comprises control information.

19. The method of claim 9, wherein the codeword is decoded, by the decoder, using a Polar decoding scheme.

20. An apparatus for wirelessly transmitting data in accordance with a radio technology, comprising:
at least one processor configured to:
obtain a payload to be transmitted;
partition the payload into a sequence of one or more payload sections;
for each respective payload section in the sequence of one or more payload sections:
derive sequential redundancy check information corresponding to all payload sections in the sequence of one or more payload sections starting from a first payload section to the respective payload section;
merge the respective payload section and the sequential redundancy check information corresponding to the respective payload section with a sequence of bits; and
generate a codeword by encoding the sequence of bits for transmission; and a transmitter configured to:
transmit the codeword across a wireless channel in accordance with the radio technology; and
a memory coupled with the at least one processor.

21. The apparatus of claim 20, wherein the at least one processor is further configured to: interleave the respective payload section and the corresponding sequential redundancy check information in the sequence of bits.

22. The apparatus of claim 21, wherein the at least one processor is further configured to: concatenate the respective payload section and the corresponding sequential redundancy check information to the sequence of bits.

23. The apparatus of claim 20, wherein the at least one processor is further configured to:
derive a global error detection code based on the sequence of one or more payload sections; and
merge the global error detection code with the sequence of bits.

24. An apparatus for wirelessly receiving data in accordance with a radio technology, comprising:
at least one receiver configured to:
receive a codeword from a wireless channel in accordance with the radio technology;
at least one processor configured to:
decode the codeword to obtain a sequence of bits, wherein the sequence of bits comprises:
a sequence of one or more payload sections; and
sequential redundancy check information; and
verify, for each respective payload section in the sequence of one or more payload sections, sequential redundancy check information corresponding to all decoded payload sections in the sequence of one or more payload sections starting from a first decoded payload section to the respective payload section; and
a memory coupled with the at least one processor.

25. The apparatus of claim 24, wherein the sequence of one or more payload sections are interleaved with the sequential redundancy check information in the sequence of bits.

26. The apparatus of claim 25, wherein the sequential redundancy check information corresponding to each respective payload section of the sequence of one or more payload sections is concatenated to the end of the respective payload section in the sequence of bits.

27. The apparatus of claim 24, wherein the at least one processor is further configured to:
determine, based on the verifying, that a first payload section of the sequence of one or more payload sections was not properly decoded; and at least one of:
transmit a request for retransmission of the first payload section; or
perform an advanced decoding operation, using information that the first payload section was not properly decoded and a larger decoding list size, to try to decode the first payload section.

28. The apparatus of claim 24, wherein the at least one processor is further configured to:
determine, for a first payload section of the sequence of one or more payload sections of the codeword, a list of possible decoding paths through a plurality of trellis stages of a list decoder for the first payload section; and
prune, based on the sequential redundancy check information corresponding to the first payload section, the list of possible decoding paths to determine a list of correct decoding paths for the first payload section.

29. The apparatus of claim 28, wherein the at least one processor is further configured to terminate decoding early if all of the possible decoding paths for the first payload section are pruned.

\* \* \* \* \*